(12) United States Patent
Nishioka

(10) Patent No.: US 9,690,178 B2
(45) Date of Patent: Jun. 27, 2017

(54) LIGHT EMITTING DEVICE AND PROJECTOR

(71) Applicant: Seiko Epson Corporation, Tokyo (JP)

(72) Inventor: Hiroki Nishioka, Chino (JP)

(73) Assignee: Seiko Epson Corporation (JP)

( * ) Notice: Subject to any disclaimer, the term of this patent is extended or adjusted under 35 U.S.C. 154(b) by 6 days.

(21) Appl. No.: 14/757,401

(22) Filed: Dec. 23, 2015

(65) Prior Publication Data

US 2016/0190385 A1    Jun. 30, 2016

(30) Foreign Application Priority Data

Dec. 24, 2014  (JP) ................................. 2014-260944

(51) Int. Cl.
| | |
|---|---|
| *G03B 21/00* | (2006.01) |
| *G03B 21/20* | (2006.01) |
| *H01L 33/00* | (2010.01) |
| *H01L 33/10* | (2010.01) |
| *H01L 33/14* | (2010.01) |

(Continued)

(52) U.S. Cl.
CPC ....... *G03B 21/2033* (2013.01); *G03B 21/005* (2013.01); *H01L 33/0045* (2013.01); *H01L 33/10* (2013.01); *H01L 33/14* (2013.01); *H01L 33/20* (2013.01); *H01L 33/36* (2013.01); *H01L 33/38* (2013.01)

(58) Field of Classification Search
CPC .............. G03B 21/005; G03B 21/2033; H01L 33/0045; H01L 33/10; H01L 33/14; H01L 33/20; H01L 33/36; H01L 33/38
See application file for complete search history.

(56) References Cited

U.S. PATENT DOCUMENTS

| | | | |
|---|---|---|---|
| 4,832,430 A | * | 5/1989 | Tada ..................... G02F 1/3138 385/18 |
| 5,008,889 A | | 4/1991 | Wilson |

(Continued)

FOREIGN PATENT DOCUMENTS

JP    2012-043950 A    3/2012

OTHER PUBLICATIONS

Extended European Search Report for Application No. EP 15 20 1989 dated Apr. 18, 2016 (9 pages).

(Continued)

*Primary Examiner* — Sultan Chowdhury
*Assistant Examiner* — Magda Cruz
(74) *Attorney, Agent, or Firm* — Harness, Dickey & Pierce, P.L.C.

(57) ABSTRACT

In a light emitting device, a second electrode is provided over a ridge portion having a constant width in a plan view, a second cladding layer includes an electrical connection region electrically connected to the second electrode, the active layer constitutes a light waveguide through which light is guided in a region overlapping the ridge portion in the plan view, the light waveguide is provided with a first light emission surface and a second light emission surface from which the light is emitted, and, in the plan view, a width of the electrical connection region at a central position equidistant from the first light emission surface and the second light emission surface is smaller than a width of an end of the electrical connection region in an extending direction of the light waveguide.

10 Claims, 20 Drawing Sheets

(51) Int. Cl.
 *H01L 33/20* (2010.01)
 *H01L 33/36* (2010.01)
 *H01L 33/38* (2010.01)

(56) References Cited

U.S. PATENT DOCUMENTS

| | | | |
|---|---|---|---|
| 7,747,128 B2* | 6/2010 | Kikuchi | G02F 1/065 |
| | | | 385/129 |
| 2003/0099438 A1* | 5/2003 | Koyama | G02B 6/12002 |
| | | | 385/41 |
| 2007/0165685 A1 | 7/2007 | Mizuuchi et al. | |
| 2011/0303892 A1 | 12/2011 | Mochizuki | |
| 2011/0303924 A1 | 12/2011 | Mochizuki | |
| 2013/0292723 A1 | 11/2013 | Ohno | |
| 2013/0308333 A1 | 11/2013 | Alphonse | |
| 2014/0218701 A1 | 8/2014 | Nishioka | |
| 2014/0240682 A1 | 8/2014 | Nishioka | |
| 2014/0334508 A1 | 11/2014 | Lauer et al. | |

OTHER PUBLICATIONS

Koyama, F. et al., "1.5 W Operation of Superluminexcent Diode With Highly Strained GaInAs/GaAs Quantum Well Emitting at 1.2 µm Band", Semiconductor Laser Conference, Conference Digest, IEEE 17T H International Sep. 25-28, 2000, Piscataway, NJ, IEEE, pp. 71-72.

Lee, Seung Yeol et al., "Fabrication of Self-Aligned Ridge Waveguide Lasers With Spot-Size Converter for Quantum Well Intermixed Superluminescent Diodes", Semiconductor Science and Technology, IOP Publishing Ltd., GB, vol. 23, No. 2, Feb. 2, 2008, 25013, pp. 1-6.

* cited by examiner

LIGHT EMITTING DEVICE AND PROJECTOR

BACKGROUND

1. Technical Field

The present invention relates to a light emitting device and a projector.

2. Related Art

A semiconductor light emitting device such as a semiconductor laser or a super luminescent diode (hereinafter, referred to as an "SLD") is used as, for example, a light source of a projector. The SLD is a semiconductor light emitting device which has an incoherent property in the same manner as a normal light emitting diode, exhibits a wide-band spectral shape, and can generate an output of several hundreds mW with a single element in the same manner as the semiconductor laser in terms of light output characteristics.

The SLD includes a refractive index waveguide in which a structure for lowering a refractive index is provided on both sides of a region of an active layer into which a current is injected and light is confined in an in-surface direction, and a gain waveguide in which the region of the active layer into which a current is injected is used as a light waveguide as it is without providing the structure for lowering a refractive index. In the refractive index waveguide type, light can be efficiently confined so as to be amplified, and thus it is possible to implement a more highly efficient SLD.

For example, JP-A-2012-43950 discloses a refractive index waveguide SLD having a waveguide which is tilted in a stripe shape.

Light is exponentially amplified toward a light emission surface which emits the light in a light waveguide of the above-described SLD. For this reason, there is a case where gain saturation may occur due to the number of carriers converted into light becoming insufficient in the vicinity of the light emission surface, and thus the output of the SLD may be reduced.

SUMMARY

An advantage of some aspects of the invention is to provide a light emitting device which can achieve high output by reducing gain saturation. Another advantage of some aspects of the invention is to provide a projector including the light emitting device.

A light emitting device according to an aspect of the invention includes a first cladding layer; an active layer that is provided on the first cladding layer and can generate light with a current injected thereinto; a second cladding layer that is provided on the active layer and includes a ridge portion which is thicker than a remaining portion of the second cladding layer; and a first electrode and a second electrode that inject a current into the active layer, in which the second electrode is provided over the ridge portion, in which the ridge portion has a constant width in a plan view (a stacking direction of the active layer and the first cladding layer), in which the second cladding layer includes an electrical connection region that is electrically connected to the second electrode, and in which the active layer constitutes a light waveguide through which light is guided in a region overlapping the ridge portion when viewed from the stacking direction. Here, the light waveguide is provided with a first light emission surface and a second light emission surface from which light is emitted, and, when viewed from the stacking direction, a width of the electrical connection region at a central position equidistant from the first light emission surface and the second light emission surface is smaller than a width of an end of the electrical connection region in an extending direction of the light waveguide.

In the light emitting device, it is possible to reduce gain saturation and thus to achieve high output.

In the description of the invention, in a case where the term "over" is used in, for example, another specific element (hereinafter, referred to as "B") being formed "over" a specific element (hereinafter, referred to as "A"), the term "over" is used in order to include a case where B is directly formed on A and a case where B is formed on A via an intervening third element.

The light emitting device according to the aspect of the invention may further include a contact layer that is provided between the ridge portion and the second electrode, and, when viewed from the stacking direction, a width of the contact layer at the central position may be smaller than a width of the contact layer at the end of the electrical connection region.

In the light emitting device with this configuration, it is possible to reduce gain saturation and thus to achieve high output.

In the light emitting device according to the aspect of the invention, when viewed from the stacking direction, a width of the electrical connection region may be increased toward the end of the electrical connection region from the central position.

In the light emitting device with this configuration, it is possible to emit light with high efficiency.

In the light emitting device according to the aspect of the invention, the light waveguide may extend in a tilted direction with respect to a normal line of the first light emission surface and a normal line of the second light emission surface.

In the light emitting device with this configuration, a direct resonator is not formed, and thus it is possible to prevent laser oscillation of light generated in the light waveguide. As a result, it is possible to reduce speckle noise in the light emitting device.

In the light emitting device according to the aspect of the invention, the light waveguide may be provided with a first region including the central position; a second region including the first light emission surface; and a third region including the second light emission surface. Here, the second cladding layer may include a plurality of noncontact regions that are not electrically connected to the second electrode, and the plurality of noncontact regions may intersect the light waveguide when viewed from the stacking direction of the active layer and the first cladding layer. When viewed from the stacking direction, a ratio of an area in which the plurality of noncontact regions overlap the first region to an area of the first region may be greater than a ratio of an area in which the plurality of noncontact regions overlap the second region to an area of the second region, and may be greater than a ratio of an area in which the plurality of noncontact regions overlap the third region to an area of the third region.

In the light emitting device with this configuration, it is possible to reduce gain saturation and thus to achieve high output.

A projector according to another aspect of the invention includes the light emitting device according to the aspect of the invention; a light modulation device that modulates light emitted from the light emitting device according to image information; and a projection device that projects an image formed by the light modulation device.

The projector includes the light emitting device according to the aspect of the invention and can thus achieve high luminance.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to improperly limit the scope of the invention disclosed in the appended claims. It cannot be said that all constituent elements described below are essential constituent elements of the invention.

1. First Embodiment 1.1. Light Emitting Device

Figure 1:
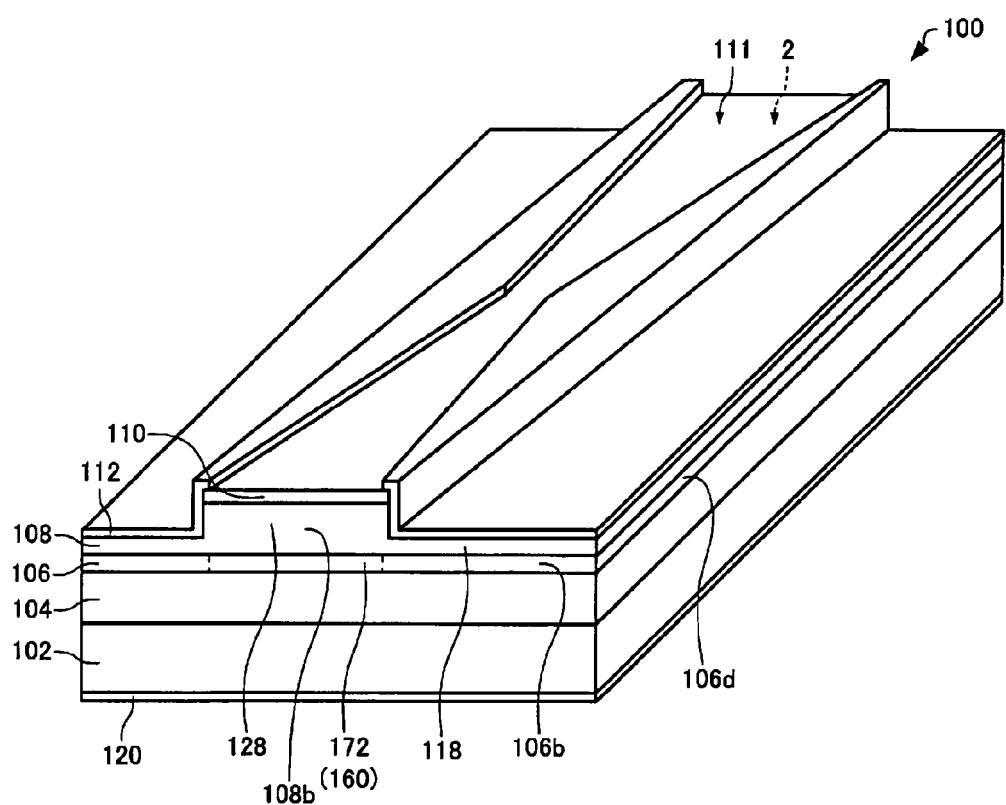
FIG. 1 is a perspective view schematically illustrating a light emitting device according to a first embodiment.
Figure 2:
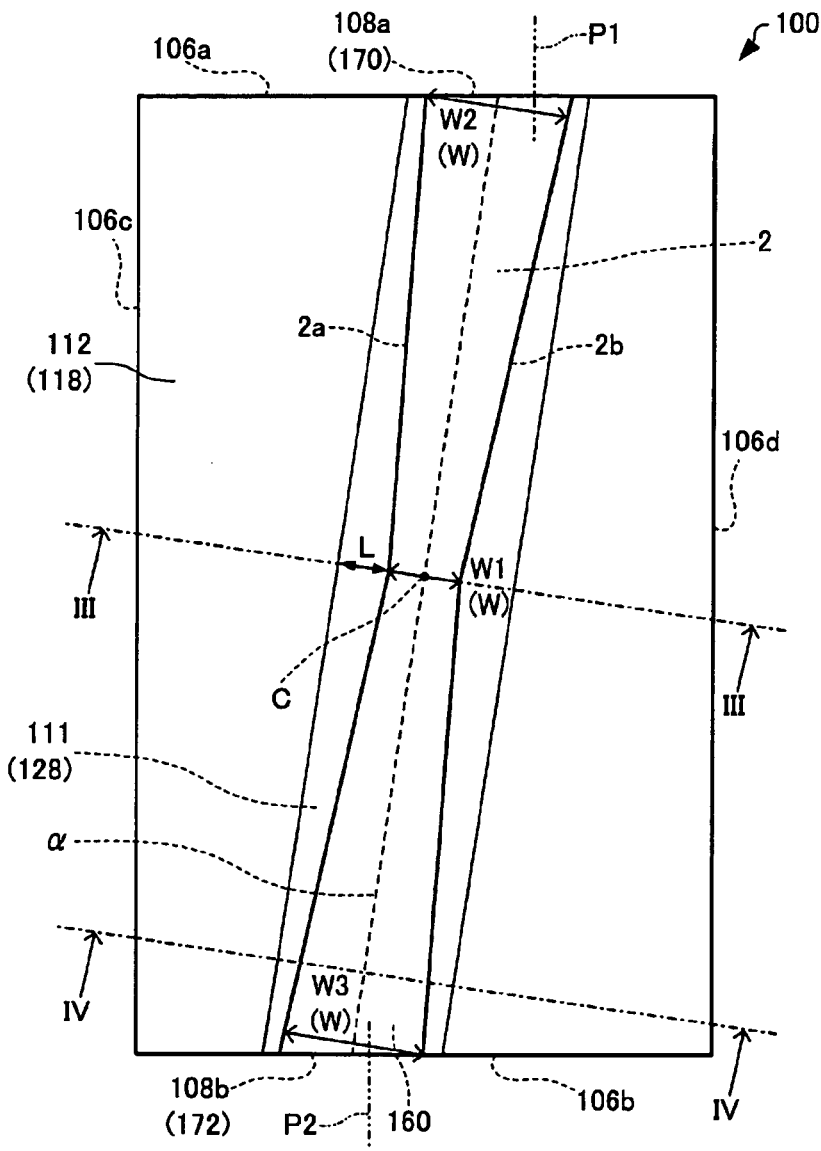
FIG. 2 is a plan view schematically illustrating the light emitting device according to the first embodiment.
Figure 3:
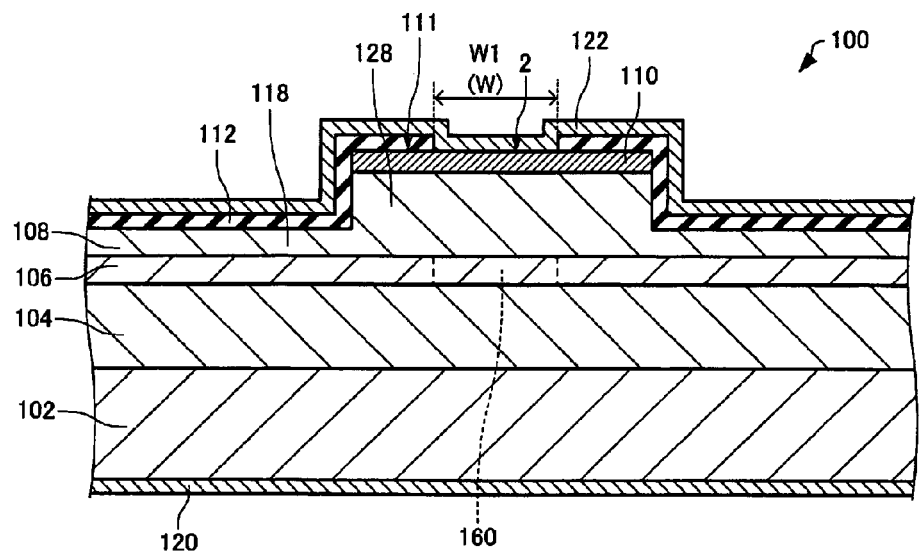
FIG. 3 is a sectional view schematically illustrating the light emitting device according to the first embodiment.
Figure 4:
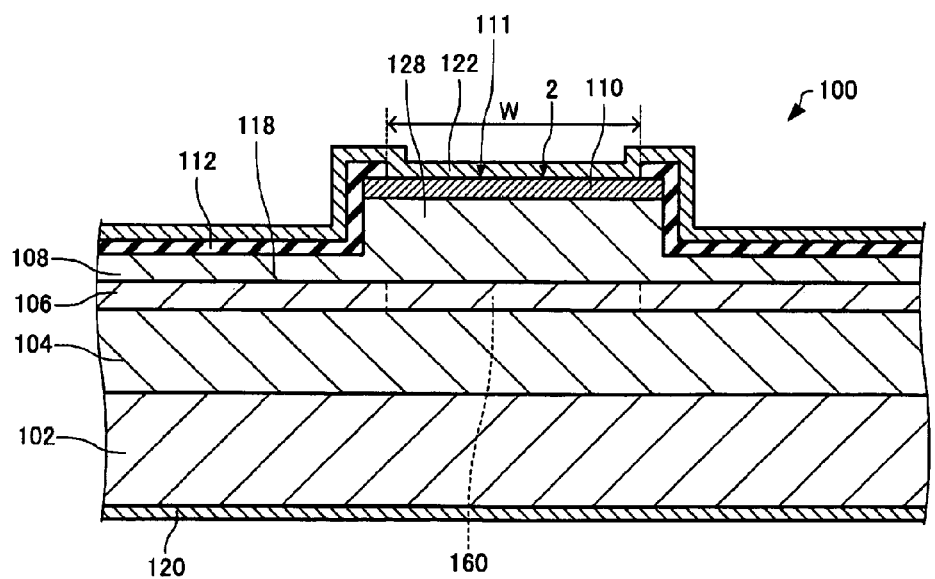
FIG. 4 is a sectional view schematically illustrating the light emitting device according to the first embodiment.

First, a description will be made of a light emitting device according to a first embodiment with reference to the drawings. FIG. 1 is a perspective view illustrating a light emitting device 100 according to the first embodiment. FIG. 2 is a plan view schematically illustrating the light emitting device 100 according to the first embodiment. FIG. 3 is a sectional view taken along the line III-III of FIG. 2 and schematically illustrates the light emitting device 100 according to the first embodiment. FIG. 4 is a sectional view taken along the line IV-IV of FIG. 2 and schematically illustrates the light emitting device 100 according to the first embodiment.

The light emitting device 100 includes, as illustrated in FIGS. 1 to 4, a substrate 102, a first cladding layer 104, an active layer 106, a second cladding layer 108, a contact layer 110, an insulating layer 112, a first electrode 120, and a second electrode 122. For convenience, FIGS. 1 and 2 do not illustrate the second electrode 122.

The substrate 102 is, for example, a first conductivity type (for example, an n-type) GaAs substrate.

The first cladding layer 104 is provided on the substrate 102. The first cladding layer 104 is, for example, an n-type InGaAlP layer. Although not illustrated, a buffer layer may be formed between the substrate 102 and the first cladding layer 104. The buffer layer is, for example, an n-type GaAs layer, AlGaAs layer, or InGaP layer. The buffer layer can improve crystal quality of a layer formed thereon.

The active layer 106 is provided on the first cladding layer 104. The active layer 106 has, for example, a multiple quantum well (MQW) structure in which three quantum well structures each having an InGaP well layer and an InGaAlP barrier layer overlap each other.

As illustrated in FIG. 2, the active layer 106 has a first side surface 106a, a second side surface 106b, a third side surface 106c, and a fourth side surface 106d. The side surfaces 106a and 106b are surfaces (parallel surfaces in the illustrated example) which face in directions opposite to each other. The side surfaces 106c and 106d are surfaces (parallel surfaces in the illustrated example) which face in directions opposite to each other, and are surfaces which are connected to the side surfaces 106a and 106b. The side surfaces 106a, 106b, 106c and 106d are surfaces which do not come into planar contact with the cladding layers 104 and 108. The side surfaces 106a and 106b may be cleavage surfaces which are formed through cleavage.

The active layer 106 is a layer into which a current is injected and which can generate light. The active layer 106 constitutes a light waveguide 160 through which light is guided. Light guided through the light waveguide 160 may receive a gain in the light waveguide 160.

The light waveguide 160 extends from the first side surface 106a to the second side surface 106b when viewed from the stacking direction of the active layer 106 and the first cladding layer 104 (hereinafter, referred to as "in a plan view"). The light waveguide 160 has a first light emission surface 170 and a second light emission surface 172 which allows light to be emitted. The first light emission surface 170 is a connection portion with the first side surface 106a of the light waveguide 160. The second light emission surface 172 is a connection portion with the second side surface 106b of the light waveguide 160. The light waveguide 160 extends in a tilted direction with respect to a normal line P1 of the first light emission surface 170 and a normal line P2 of the second light emission surface 172. In the illustrated example, a vertical straight line (a central line α) which passes through a center of the first light emission surface 170 and the center of the second light emission surface 172 extends in a tilted direction with respect to the normal lines P1 and P2.

The light waveguide 160 includes a central position C equidistant from the first light emission surface 170 and the second light emission surface 172. In the example illustrated in FIG. 1, the central position C is a point on the central line α whose distances to the light emission surfaces 170 and 172 are the same as each other.

The second cladding layer 108 is provided on the active layer 106. The second cladding layer 108 is, for example, a second conductivity type (for example, a p-type) InGaAlP layer. Each of the cladding layers 104 and 108 has a band gap larger than that of the active layer 106 and a refractive index smaller than that thereof. The cladding layers 104 and 108 are provided with the active layer 106 interposed therebetween and have a function of minimizing leakage of injected carriers (electrons and holes) and light.

The second cladding layer 108 is provided with a ridge portion 128 (e.g., "includes" the ridge portion 128) thicker than a remaining portion 118. The remaining portion 118 is a portion other than the ridge portion 128 of the second cladding layer 108. The ridge portion 128 extends from a side surface 108a of the second cladding layer 108 connected to the first side surface 106a to a side surface 108b of the second cladding layer 108 connected to the second side surface 106b. The ridge portion 128 has a constant width from the side surface 108a to the side surface 108b in a plan view. An extending direction of the ridge portion 128 is the same as the direction of the central line α in a plan view. In the illustrated example, a planar shape (a shape viewed from the stacking direction of the active layer 106 and the first cladding layer 104) of the ridge portion 128 is a parallelogramatic shape. The active layer 106 constitutes the light waveguide 160 in the region overlapping the ridge portion 128 in a plan view.

The width of the ridge portion 128 is a size in a direction parallel to the side surfaces 108a and 108b of the ridge portion 128 in a plan view. The ridge portion 128 having the constant width includes a case where the ridge portion 128 has a completely constant width from the side surface 108a to the side surface 108b and a case where the ridge portion 128 has a substantially constant width. The case where the ridge portion 128 has a substantially constant width is a case where the width of the ridge portion 128 changes due to a manufacturing error.

In the light emitting device 100, a pin diode is constituted of the p-type second cladding layer 108, the active layer 106 with which impurities are not doped, and the n-type first cladding layer 104. In the light emitting device 100, if a forward bias voltage of the pin diode is applied (a current is injected) between the electrodes 120 and 122, the light waveguide 160 is generated in the active layer 106, and recombination between electrons and holes occurs in the light waveguide 160. This recombination causes light to be emitted. Chain inductive emission occurs due to the generated light, and thus the intensity of the light is amplified in the light waveguide 160. The light waveguide 160 is constituted of the active layer 106 through which the light is guided, and the cladding layers 104 and 108 which minimize leakage of the light.

The contact layer 110 is provided on the ridge portion 128. The contact layer 110 is provided between the ridge portion 128 and the second electrode 122. A planar shape of the contact layer 110 is the same as, for example, a planar shape of the ridge portion 128. The contact layer 110 is, for example, a p-type GaAs layer. The contact layer 110 is in ohmic contact with the second electrode 122. The contact layer 110 is more conductive than the cladding layers 104 and 108.

The contact layer 110 and the ridge portion 128 constitute a pillar shape portion 111. The light emitting device 100 is a refractive index waveguide type SLD. A planar shape of the light waveguide 160 may be the same as a shape of a contact surface between the pillar shape portion 111 (contact layer 110) and the second electrode 122. A planar shape of the light waveguide 160 may be a shape (a shape which becomes wider as a current from the contact portion between the contact layer 110 and the second electrode 122 is diffused) which is wider in a direction perpendicular to the extending direction of the light waveguide 160 than the shape of the contact surface between the pillar shape portion 111 and the second electrode 122. Although not illustrated, a side surface of the pillar shape portion 111 may be tilted.

The second cladding layer 108 is electrically connected to the second electrode 122 via the contact layer 110. A planar shape of an electrical connection region 2 in which the second cladding layer 108 is electrically connected to the second electrode 122 is the same as the planar shape of the contact surface between the contact layer 110 and the second electrode 122.

The electrical connection region 2 has a width W in a plan view. The width W is a size of the light waveguide 160 in a direction perpendicular to the extending direction (the direction of the central line α). In a plan view, a width W1 of the electrical connection region 2 at the central position C is smaller than a width W2 of one end (here, the first light emission surface 170) of the electrical connection region 2 in the extending direction of the light waveguide 160 and is smaller than a width W3 of the other end (here, the second light emission surface 172) of the electrical connection region 2 in the extending direction of the light waveguide 160.

The width W2 of the first light emission surface 170 of the electrical connection region 2 indicates a line segment having the largest length among line segments which are perpendicular to the central line α in a plan view and extend from the first light emission surface 170 to a boundary 2a or a boundary 2b of the electrical connection region 2. In the example illustrated in FIG. 2, the width W2 is a length of a line segment which is perpendicular to the central line α and extends from an end of the first light emission surface 170 on the third side surface 106c side to the boundary 2b. Here, the boundaries 2a and 2b are boundaries between the electrical connection region 2 and the insulating layer 112 in a plan view. The boundary 2a is a boundary on the third side surface 106c side, and the boundary 2b is a boundary on the fourth side surface 106d side.

The width W3 of the second light emission surface 172 of the electrical connection region 2 indicates a line segment having the largest length among line segments which are perpendicular to the central line α in a plan view and extend from the second light emission surface 172 to the boundary 2a or the boundary 2b of the electrical connection region 2. In the example illustrated in FIG. 2, the width W3 is a length of a line segment which is perpendicular to the central line α and extends from an end of the second light emission surface 172 on the fourth side surface 106d side to the boundary 2a.

The width W of the electrical connection region 2 is increased toward one end (here, the first light emission surface 170) of the electrical connection region 2 from the central position C in a plan view. In other words, the width W monotonously increases from the width W1 at the central position C to the width W2 toward the first light emission surface 170 side in a plan view. The electrical connection region 2 has a tapered shape from the central position C toward the first light emission surface 170 in a plan view.

The width W of the electrical connection region 2 is increased toward the other end (here, the second light emission surface 172) of the electrical connection region 2 from the central position C in a plan view. In other words, the width W monotonously increases from the width W1 at the central position C to the width W3 toward the second light emission surface 172 side in a plan view. The electrical connection region 2 has a tapered shape from the central position C toward the second light emission surface 172 in a plan view.

The electrical connection region 2 is symmetrically disposed with respect to, for example, the central position C. Consequently, the intensity of light emitted from the first light emission surface 170 can be made the same as the intensity of light emitted from the second light emission surface 172.

In the example illustrated in FIG. 2, the width W is the minimum at the central position C, but the width W may be the minimum at positions other than the central position C as long as the width W1 at the central position C is smaller than the widths W2 and W3 at the light emission surfaces 170 and 172.

In a plan view, a distance L between the boundary 2a of the electrical connection region 2 and a boundary of the ridge portion 128 (a boundary on the third side surface 106c) in the direction perpendicular to the central line α at the central position C is, for example, 20 μm or less. Similarly, a distance between the boundary 2b of the electrical connection region 2 and a boundary of the ridge portion 128 (a boundary on the fourth side surface 106d) in the direction perpendicular to the central line α at the central position C is, for example, 20 μm or less.

The insulating layer 112 is provided on the second cladding layer 108, the lateral sides of the pillar shape portion 111 (the periphery of the pillar shape portion 111 in a plan view), and a part of the top of the pillar shape portion 111.

In the illustrated example, a planar shape of the electrical connection region 2 is determined depending on a planar shape of an opening of the insulating layer 112 provided on the pillar shape portion 111. The insulating layer 112 is, for example, a SiN layer, a SiO$_2$ layer, a SiON layer, an Al$_2$O$_3$ layer, or a polyimide layer. In a case where the above-described material is used as the insulating layer 112, a current between the electrodes 120 and 122 avoids the insulating layer 112 and flows through the pillar shape portion 111 located between the insulating layers 112.

The insulating layer 112 has a refractive index lower than a refractive index of the second cladding layer 108. An effective refractive index of a vertical section of the portion forming the insulating layer 112 is lower than an effective refractive index of a vertical section of the portion not forming the insulating layer 112, that is, the portion forming the pillar shape portion 111. Although not illustrated, the insulating layer 112 may not be provided. In this case, air surrounding the pillar shape portion 111 functions in the same manner as the insulating layer 112.

The first electrode 120 is provided under the substrate 102. The first electrode 120 is provided on a lower surface of a layer (the substrate 102 in the illustrated example) which is in ohmic contact with the first electrode 120. The first electrode 120 is one electrode for driving (for injecting a current into the active layer 106) the light emitting device 100. As the first electrode 120, for example, an electrode is used in which a Cr layer, a AuGe layer, a Ni layer, and a Au layer are stacked in this order from the first cladding layer 104 side.

The second electrode 122 is provided over the ridge portion 128. Specifically, the second electrode 122 is provided on the contact layer 110 and the insulating layer 112. The second electrode 122 is the other electrode (for injecting a current into the active layer 106) the light emitting device 100. As the second electrode 122, for example, an electrode is used in which a Cr layer, a AuZn layer, and a Au layer are stacked in this order from the pillar shape portion 111 side.

Although not illustrated, antireflection (AR) films may be provided on the side surfaces 106a and 106b. Consequently, light can be efficiently emitted from the light emission surfaces 170 and 172. The antireflection films may be formed of, for example, a SiO$_2$ layer, a Ta$_2$O$_5$ layer, an Al$_2$O$_3$ layer, a TiN layer, a TiO$_2$ layer, a SiON layer, or a SiN layer, or multiple layers thereof.

In the above description, the AlGaInP-based light emitting device 100 has been described, but all materials may be used which can form a light emitting device and a light waveguide according to an embodiment of the invention. Regarding semiconductor materials, for example, AlGaN-based, GaN-based, InGaN-based, GaAs-based, AlGaAs-based, InGaAs-based, InGaAsP-based, InP-based, GaP-based, AlGaP-based, and ZnCdSe-based semiconductor materials may be used.

The light emitting device 100 is applicable to light sources of, for example, a projector, a display, a lighting apparatus, and a measurement apparatus.

The light emitting device 100 has the following features, for example.

In the light emitting device 100, the width W1 of the electrical connection region 2 at the central position C is smaller than the widths W2 and W3 of the electrical connection region 2 in the extending direction of the light waveguide 160 in a plan view. Therefore, in the light emitting device 100, it is possible to reduce gain saturation and thus to achieve high output. Hereinafter, the reason thereof will be described.

Figure 5A:
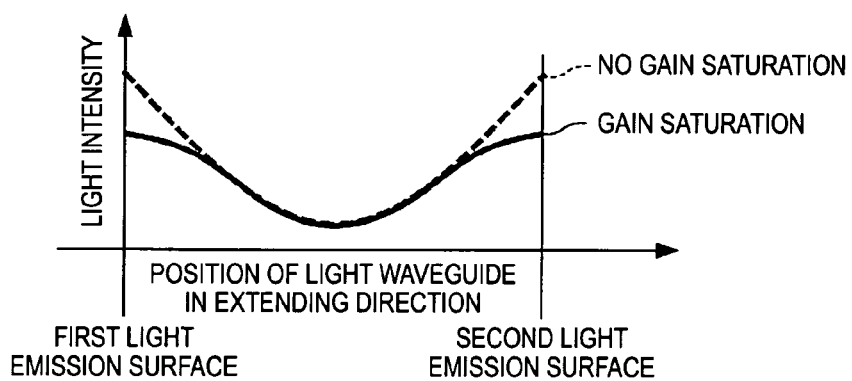
FIGS. 5A and 5B are diagrams for explaining a relationship between a position of a light waveguide in an extending direction, light intensity, and a current amount per unit length.
Figure 5B:
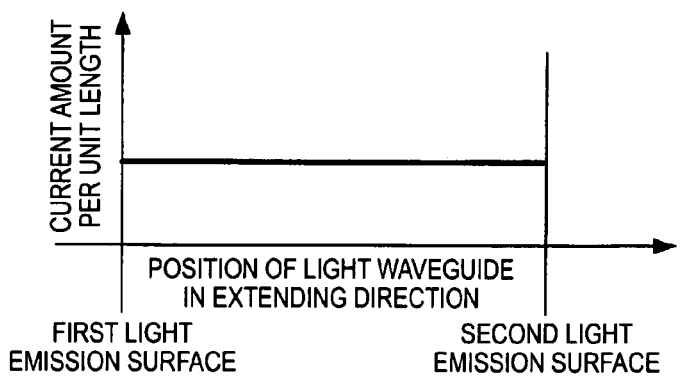
Figure 6A:
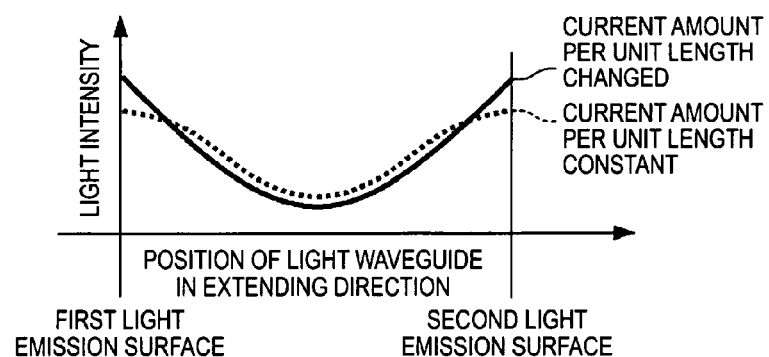
FIGS. 6A and 6B are diagrams for explaining a relationship between a position of the light waveguide in the extending direction, light intensity, and a current amount per unit length.
Figure 6B:
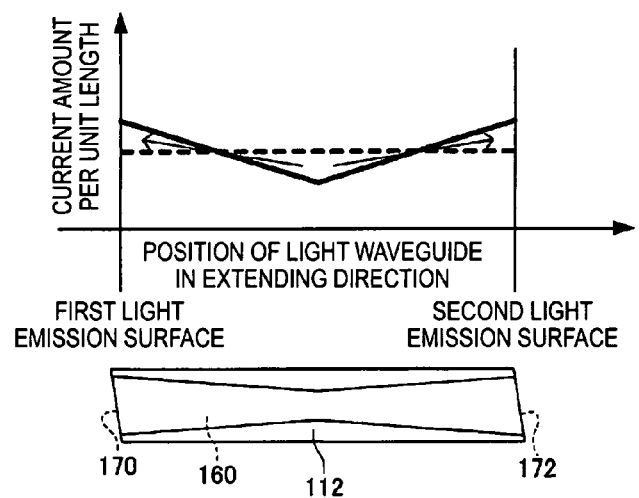

FIGS. 5A and 6A are diagrams for explaining a relationship between a position of the light waveguide in the extending direction (propagation direction) and light intensity. FIGS. 5B and 6B are diagrams for explaining a relationship between a position of the light waveguide in the extending direction and a current amount per unit length.

The position of the light waveguide in the extending direction expressed by the transverse axes of FIGS. 5A to 6B indicates a position of the light waveguide in the extending direction between the first light emission surface (one end of the electrical connection region 2) and the second light emission surface (the other end of the electrical connection region 2).

Figure 7:
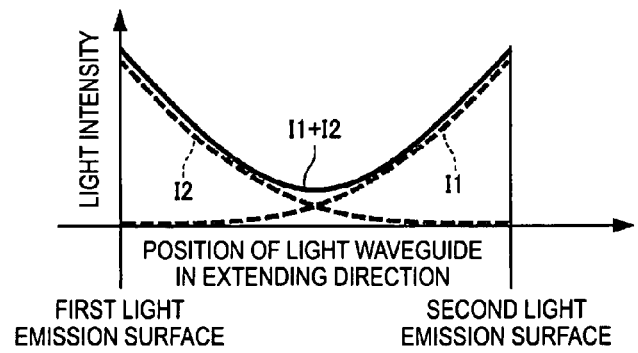
FIG. 7 is a diagram for explaining a relationship between a position of the light waveguide in the extending direction and light intensity.

The light intensity expressed by the longitudinal axes of FIGS. 5A and 6A indicates the number of photons which pass through a section perpendicular to the extending direction of the light waveguide per time unit at a position of the light waveguide in the extending direction. The light intensity of FIGS. 5A and 6A is a sum of light intensity I1 of light which is directed from the first light emission surface toward the second light emission surface and light intensity I2 of light which is directed from the second light emission surface toward the first light emission surface, as illustrated in FIG. 7.

The current amount per unit length expressed by the longitudinal axes of FIGS. 5B and 6B is an amount of current which flows through a portion at a certain position of the light waveguide 160 in the extending direction, in the stacking direction (the stacking direction of the active layer 106 and the first cladding layer 104). In other words, the current amount per unit length corresponds to the width W of the electrical connection region 2.

In the SLD, light is exponentially amplified toward a light emission surface (a surface having a lower reflectance). For this reason, as illustrated in FIGS. 5A and 5B, the light intensity has a nonuniform distribution in the extending direction of the light waveguide. Thus, in a case where the current amount per unit length is constant in the extending direction of the light waveguide, carriers become insufficient relative to light (relative to photons) in the vicinity of the light emission surface. In other words, when the light is about to be amplified, carriers converted into the light becomes insufficient. As a result, gain saturation occurs in the vicinity of the light emission surface with great light intensity, and, accordingly, light output is reduced.

A portion (for example, the central position C) with small light intensity is in a state in which there are more than in the vicinity of the light emission surface, and the carriers are not sufficiently converted into light and thus remain therein. As illustrated in FIGS. 6A and 6B, such remaining carriers are injected into the vicinity of the light emission surface in which carriers are insufficient, and thus it is possible to perform driving with high efficiency while achieving high output. In other words, it is possible to reduce the gain saturation and thus to increase final light output while maintaining the magnitude of a current injected into the entire light waveguide to be constant by changing the current amount per unit length.

In the light emitting device 100, as described above, the width W1 is made smaller than the widths W2 and W3, and thus it is possible to make a current amount per unit length in the vicinity of the first light emission surface 170 and a current amount per unit length in the vicinity of the second light emission surface 172 larger than a current amount per unit length at the central position. For this reason, in the light emitting device 100, it is possible to prevent light output from being reduced due to the gain saturation without increasing an amount of current injected into the entire light waveguide 160. In other words, in the light emitting device 100, it is possible to reduce the gain saturation and thus to achieve high output.

Figure 8:
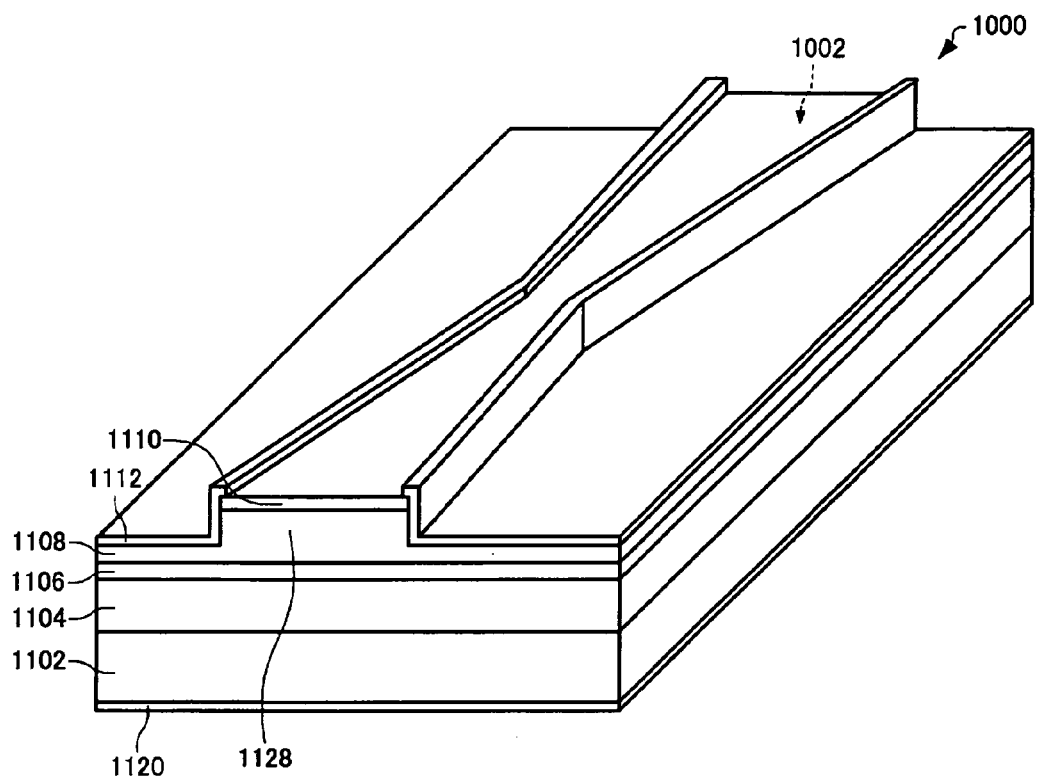
FIG. 8 is a perspective view schematically illustrating a light emitting device related to a reference example.

In the light emitting device 100, the ridge portion 128 has a constant width in a plan view. For this reason, as illustrated in FIG. 8, there are the following advantages compared with a light emitting device 1000 in which a shape of a ridge portion 1128 has a tapered shape toward a first light emission surface from a central position and has a tapered shape toward a second light emission surface from the central position in the same manner as an electrical connection region 1002. FIG. 8 is a perspective view schematically illustrating the light emitting device 1000 related to a reference example. The light emitting device 1000 is configured to include a substrate 1102, a first cladding layer 1104, an active layer 1106, a second cladding layer 1108, a contact layer 1110, an insulating layer 1112, a first electrode 1120, and a second electrode (not illustrated).

The ridge portion is formed by removing material in the vicinity thereof through etching or the like, but defects tend to occur on the side surfaces of the ridge portion at this time. The defects absorb and scatter light and thus lead to losses when the light propagates. In the light emitting device 1000, the side surfaces of the ridge portion in a plan view become longer than in the light emitting device 100. For this reason, a propagation loss of light is increased. Therefore, in order to reduce a loss of light, a width of the ridge portion is preferably constant. As described above, a planar shape of the light waveguide may be a shape which extends more in a direction perpendicular to the extending direction of the light waveguide than a shape of a contact surface between the contact layer and the second electrode, and thus light may reach the side surfaces of the ridge portion. For this reason, the side surfaces of the ridge portion are preferably short in a plan view.

In the light emitting device 1000, the ridge portion includes a narrow portion at the center. For this reason, in the light emitting device 1000, light loss may occur in the narrow portion, and thus a problem that light use efficiency is reduced may occur. In the light emitting device 1000, light density may relatively increase in the narrow portion, and thus an amount of generated heat may increase or reliability may be reduced.

In the light emitting device 100, the width W of the electrical connection region 2 is increased from the central position C toward the ends (that is, the first light emission surface 170 and the second light emission surface 172) of the electrical connection region 2 in a plan view. For this reason, in the light emitting device 100, a current amount per unit length can be monotonously increased from the central position C toward the first light emission surface 170 side. In the light emitting device 100, a current amount per unit length can be monotonously increased from the central position C toward the second light emission surface 172 side. Consequently, in the light emitting device 100, the width W can be designed so that carriers converted into light are neither insufficient nor remain, for example, when the light is about to be amplified at respective positions of the light waveguide 160 in the extending direction. As a result, the light emitting device 100 can emit light with high efficiency.

In the light emitting device 100, the light waveguide 160 extends in the tilted direction with respect to the normal line P1 of the first light emission surface 170 and the normal line P2 of the second light emission surface 172. For this reason, in the light emitting device 100, it is possible to prevent light generated in the light waveguide 160 from being directly reflected in a multiple manner between the light emission surfaces 170 and 172. Consequently, in the light emitting device 100, a direct resonator is not formed, and thus it is possible to prevent laser oscillation of light generated in the light waveguide 160. As a result, it is possible to reduce speckle noise in the light emitting device 100.

1.2. Manufacturing Method of Light Emitting Device

Figure 9:
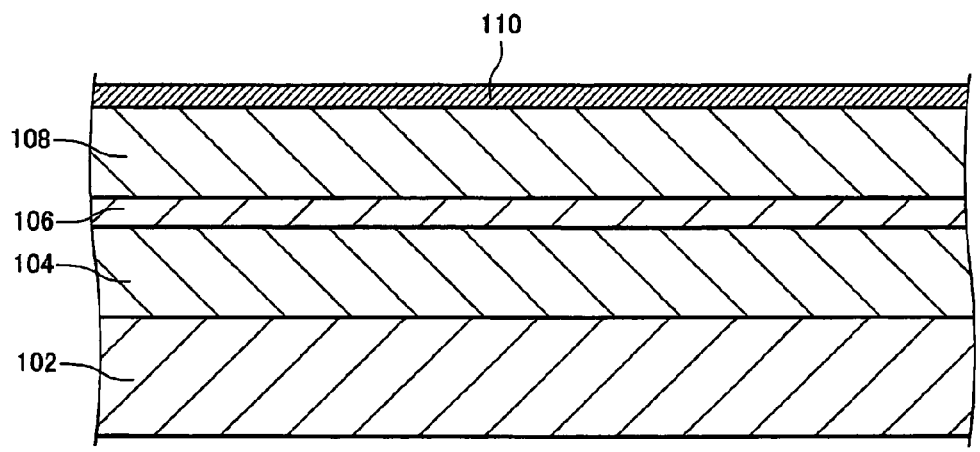
FIG. 9 is a sectional view schematically illustrating a manufacturing step of the light emitting device according to the first embodiment.
Figure 10:
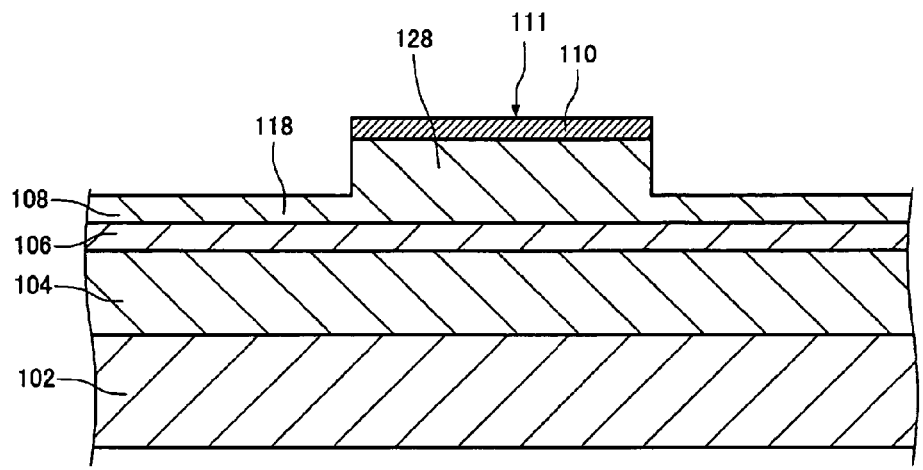
FIG. 10 is a sectional view schematically illustrating a manufacturing step of the light emitting device according to the first embodiment.

Next, a description will be made of a manufacturing method of the light emitting device 100 according to the present embodiment with reference to the drawings. FIGS. 9 and 10 are sectional views schematically illustrating manufacturing steps of the light emitting device 100 according to the present embodiment and correspond to FIG. 3.

As illustrated in FIG. 9, the first cladding layer 104, the active layer 106, the second cladding layer 108, and the contact layer 110 are subject to epitaxial growth on the substrate 102 in this order. As methods for the epitaxial growth, there may be, for example, a metal organic chemical vapor deposition (MOCVD) method, and a molecular beam epitaxy (MBE) method.

As illustrated in FIG. 10, the pillar shape portion 111 is formed by patterning the contact layer 110 and the second cladding layer 108. The patterning is performed through, for example, photolithography and etching.

As illustrated in FIG. 3, the insulating layer 112 is formed to cover the side surfaces of the pillar shape portion 111. Specifically, the insulating layer 112 is formed by forming an insulating member (not illustrated) according to a chemical vapor deposition (CVD) method (more specifically, a plasma CVD method) or a coating method and by patterning the insulating member. The patterning is performed through, for example, photolithography and etching.

Next, the second electrode 122 is formed on the contact layer 110. Next, the first electrode 120 is formed on the lower surface of the substrate 102. The electrodes 120 and 122 are formed according to, for example, a vapor deposition method or a sputtering method. An order of forming the electrodes 120 and 122 is not particularly limited.

The light emitting device 100 can be manufactured through the above-described steps.

1.3. Modification Examples of Light Emitting Device 1.3.1. Modification Example 1

Figure 11:
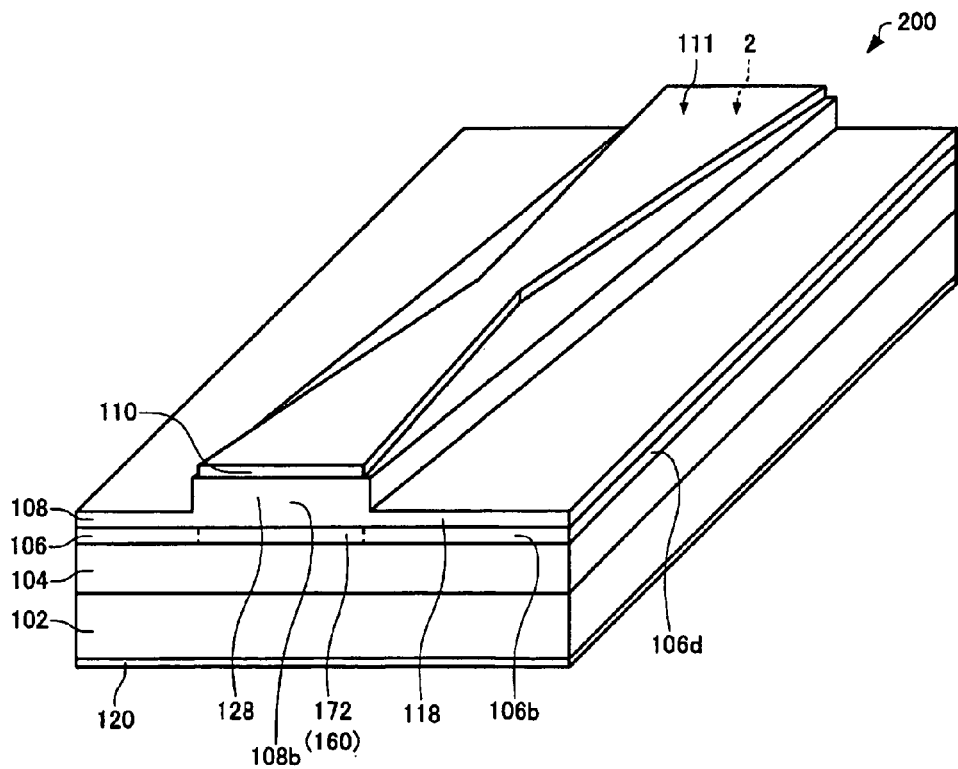
FIG. 11 is a perspective view schematically illustrating a light emitting device according to Modification Example 1 of the first embodiment.
Figure 12:
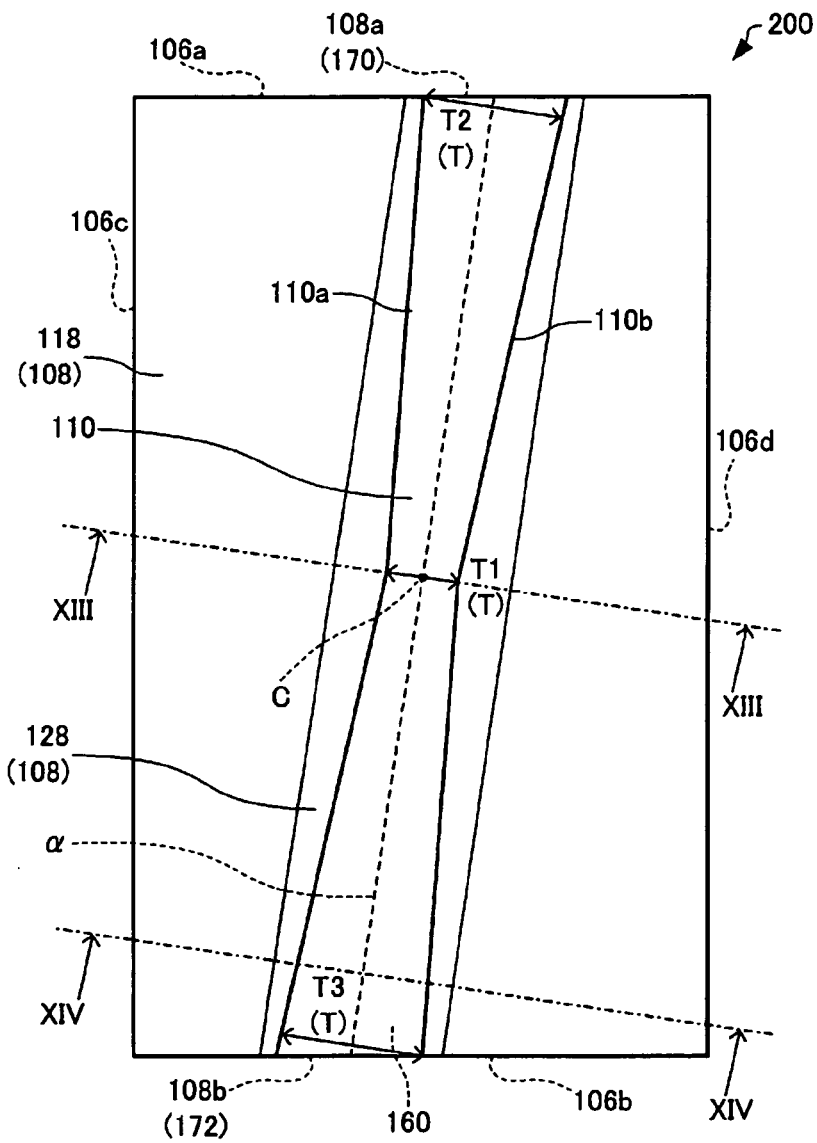
FIG. 12 is a plan view schematically illustrating the light emitting device according to Modification Example 1 of the first embodiment.
Figure 13:
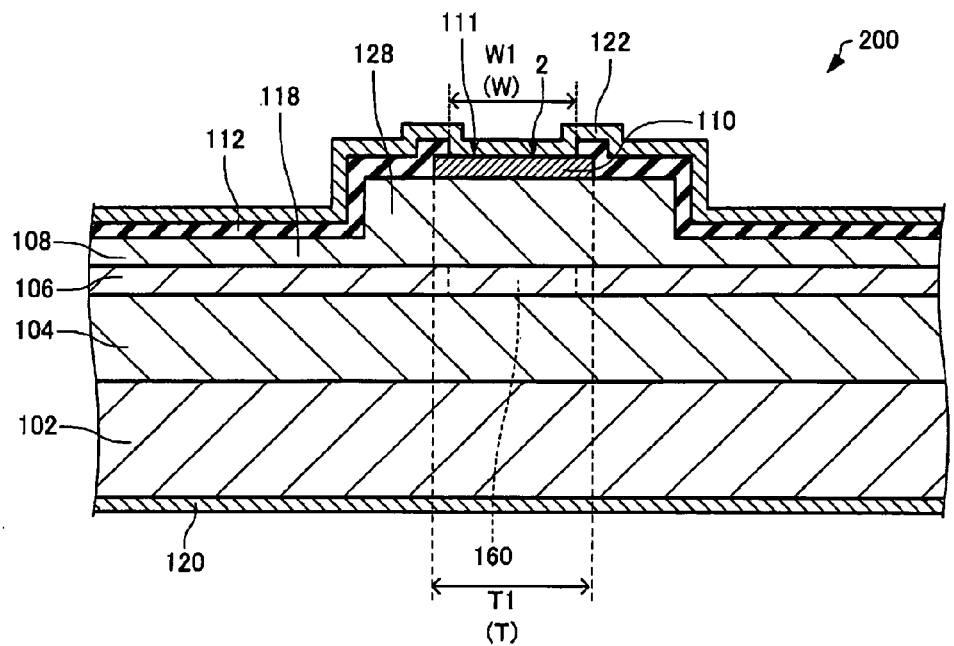
FIG. 13 is a sectional view schematically illustrating the light emitting device according to Modification Example 1 of the first embodiment.
Figure 14:
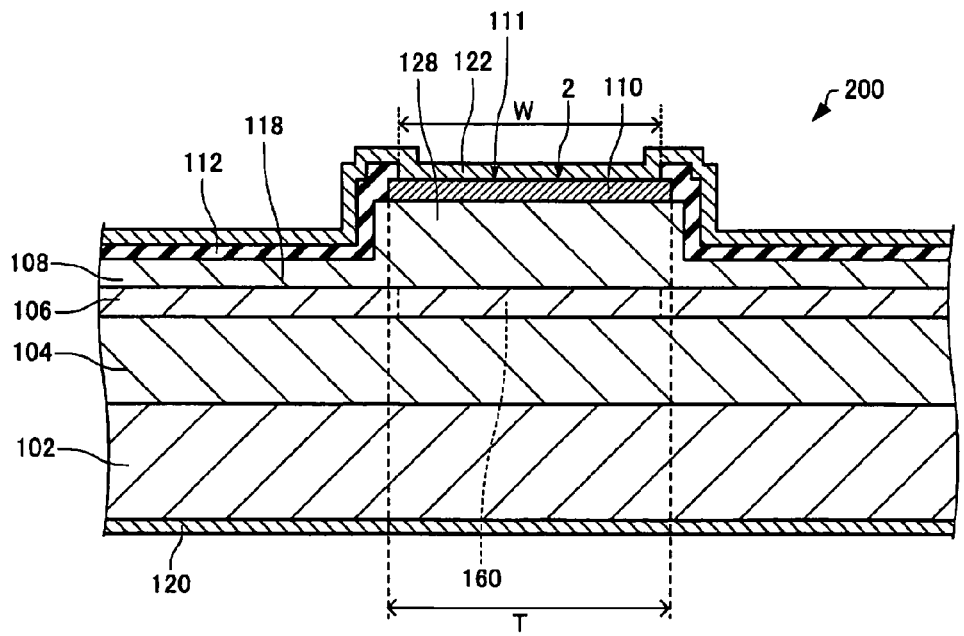
FIG. 14 is a sectional view schematically illustrating the light emitting device according to Modification Example 1 of the first embodiment.

Next, a description will be made of a light emitting device according to Modification Example 1 of the first embodiment with reference to the drawings. FIG. 11 is a perspective view schematically illustrating a light emitting device 200 according to Modification Example 1 of the first embodiment. FIG. 12 is a plan view schematically illustrating the light emitting device 200 according to Modification Example 1 of the first embodiment. FIG. 13 is a sectional view taken along the line XIII-XIII of FIG. 12 and schematically illustrates the light emitting device 200 according to Modification Example 1 of the first embodiment. FIG. 14 is a sectional view taken along the line XIV-XIV of FIG. 12 and schematically illustrates the light emitting device 200 according to Modification Example 1 of the first embodiment. For convenience, FIGS. 11 and 12 do not illustrate the insulating layer 112 and the second electrode 122.

Hereinafter, in the light emitting device 200 according to Modification Example 1 of the first embodiment, differences from the example of the light emitting device 100 according to the first embodiment will be described, and similarities thereto will not be described. This is also the same for light emitting devices according to Modification Examples 2, 3, 4 and 5 to be described later of the first embodiment.

In the above-described light emitting device 100, as illustrated in FIGS. 1 to 4, the planar shape of the contact layer 110 is the same as the planar shape of the ridge portion 128. In contrast, in the light emitting device 200, as illustrated in FIGS. 11 to 14, a planar shape of the contact layer 110 is different from a planar shape of the ridge portion 128.

The contact layer 110 has a width T in a plan view. The width T is a size of the light waveguide 160 in a direction perpendicular to the extending direction (the direction of the central line α). In a plan view, a width T1 of the contact layer 110 at the central position C is smaller than a width T2 of the contact layer 110 at the first light emission surface 170 and is smaller than a width T3 of the contact layer 110 at the second light emission surface 172 in a plan view.

The width T2 of the contact layer 110 at the first light emission surface 170 indicates a line segment having the largest length among line segments which are perpendicular to the central line α in a plan view and extend from the first light emission surface 170 to a boundary 110a or a boundary 110b of the contact layer 110. In the example illustrated in FIG. 12, the width T2 is a length of a line segment which is perpendicular to the central line α and extends from an end of the first light emission surface 170 on the third side surface 106c side to the boundary 110b. Here, the boundaries 110a and 110b are boundaries between the contact layer 110 and the insulating layer 112 in a plan view. The boundary 110a is a boundary on the third side surface 106c side, and the boundary 110b is a boundary on the fourth side surface 106d side.

The width T3 of the contact layer 110 at the second light emission surface 172 indicates a line segment having the largest length among line segments which are perpendicular to the central line α in a plan view and extend from the second light emission surface 172 to the boundary 110a or the boundary 110b of the contact layer 110. In the example illustrated in FIG. 12, the width T3 is a length of a line segment which is perpendicular to the central line α and extends from an end of the second light emission surface 172 on the fourth side surface 106d side to the boundary 110a.

The width T of the contact layer 110 is increased toward one end (here, the first light emission surface 170) of the electrical connection region 2 from the central position C in a plan view. In other words, the width T is monotonously increased from the width T1 at the central position C to the width T2 toward the first light emission surface 170 side in a plan view. The contact layer 110 has a tapered shape from the central position C toward the first light emission surface 170 in a plan view.

The width T of the contact layer 110 is increased toward the other end (here, the second light emission surface 172) of the electrical connection region 2 from the central position C in a plan view. In other words, the width T monotonously increases from the width T1 at the central position C to the width T3 toward the second light emission surface 172 side in a plan view. The contact layer 110 has a tapered shape from the central position C toward the second light emission surface 172 in a plan view.

In the light emitting device 200, for example, the pillar shape portion 111 is formed, and then the contact layer 110 is formed through patterning.

In the light emitting device 200, the width T1 of the contact layer 110 at the central position C is smaller than the widths T2 and T3 of the contact layer 110 at the ends (that is, the first light emission surface 170 and the second light emission surface 172) of the electrical connection region 2 in a plan view. For this reason, in the light emitting device 200, it is possible to more reliably make current amounts per unit length in the vicinity of the first light emission surface 170 and the second light emission surface 172 larger than a current amount per unit length at the central position C. Here, since the contact layer is highly conductive, a current injected from a portion which is in contact with the second electrode of the contact layer is diffused in the contact layer. For this reason, if a shape of the contact surface between the contact layer and the second electrode is only a tapered shape extending toward the light emission surface in a plan view, there is a case where it may be hard to inject a current into a desired region of the light waveguide, and current amounts per unit length in the vicinity of the first light emission surface 170 and the second light emission surface 172 may not be larger than a current amount per unit length at the central position. In the light emitting device 100, such a problem can be solved, and thus it is possible to easily control a region of the light waveguide 160 into which a current is injected.

1.3.2. Modification Example 2

Figure 15:
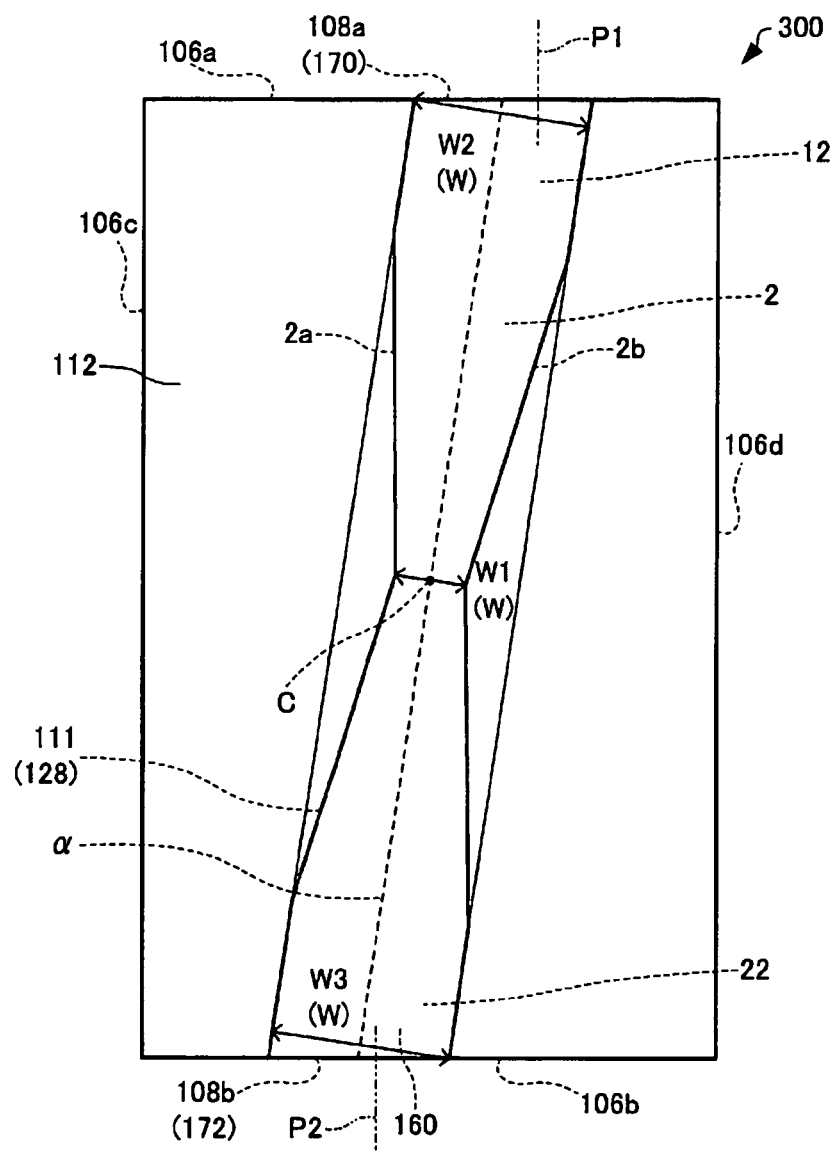
FIG. 15 is a plan view schematically illustrating a light emitting device according to Modification Example 2 of the first embodiment.

Next, a description will be made of a light emitting device according to Modification Example 2 of the first embodiment with reference to the drawings. FIG. 15 is a plan view schematically illustrating a light emitting device 300 according to Modification Example 2 of the first embodiment. For convenience, FIG. 15 does not illustrate the second electrode 122.

In the above-described light emitting device 100, as illustrated in FIG. 2, the width W of the electrical connection region 2 is increased toward the first light emission surface 170 and the second light emission surface 172 from the central position C in a plan view. In contrast, in the light emitting device 300, as illustrated in FIG. 15, the electrical connection region 2 includes a first end region 12 in which the width W (width W2) is constant on the first light emission surface 170 side and a second end region 22 in which the width W (width W3) is constant on the second light emission surface 172 side in a plan view. In the regions 12 and 22, the boundaries 2a and 2b overlap the boundaries of the ridge portion 128 in a plan view.

In the light emitting device 300, it is possible to reduce the gain saturation and thus to achieve high output in the same manner as in the light emitting device 100.

1.3.3. Modification Example 3

Figure 16:
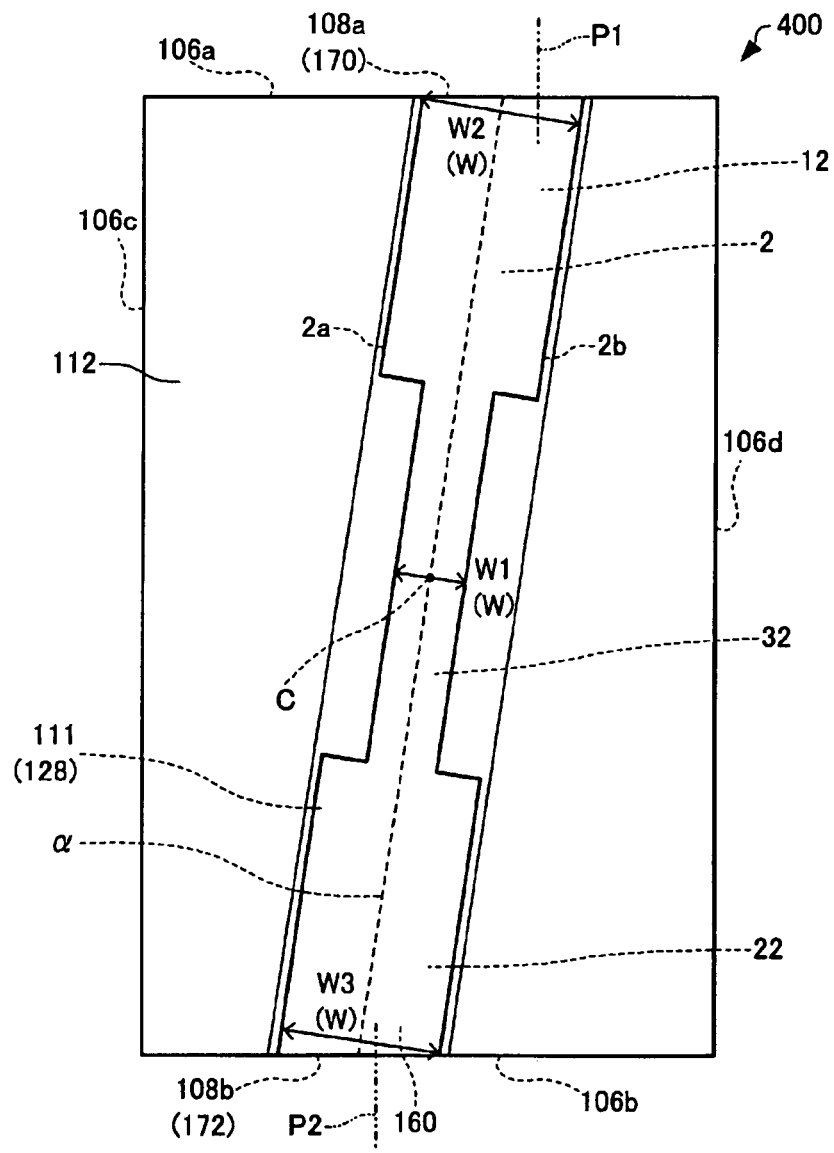
FIG. 16 is a plan view schematically illustrating a light emitting device according to Modification Example 3 of the first embodiment.

Next, a description will be made of a light emitting device according to Modification Example 3 of the first embodiment with reference to the drawings. FIG. 16 is a plan view schematically illustrating a light emitting device 400 according to Modification Example 3 of the first embodiment. For convenience, FIG. 16 does not illustrate the second electrode 122.

In the above-described light emitting device 100, as illustrated in FIG. 2, the width W of the electrical connection region 2 is increased toward the first light emission surface 170 and the second light emission surface 172 from the central position C in a plan view. In contrast, in the light emitting device 400, as illustrated in FIG. 16, the electrical connection region 2 includes a first end region 12 in which the width W (width W2) is constant on the first light emission surface 170 side, a second end region 22 in which the width W (width W3) is constant on the second light emission surface 172 side in a plan view, and a central region 32 which includes the central position C and the width W (width W1) is constant. In the illustrated example, the first end region 12 is connected to the central region 32. The second end region 22 is connected to the central region 32.

Figure 17:
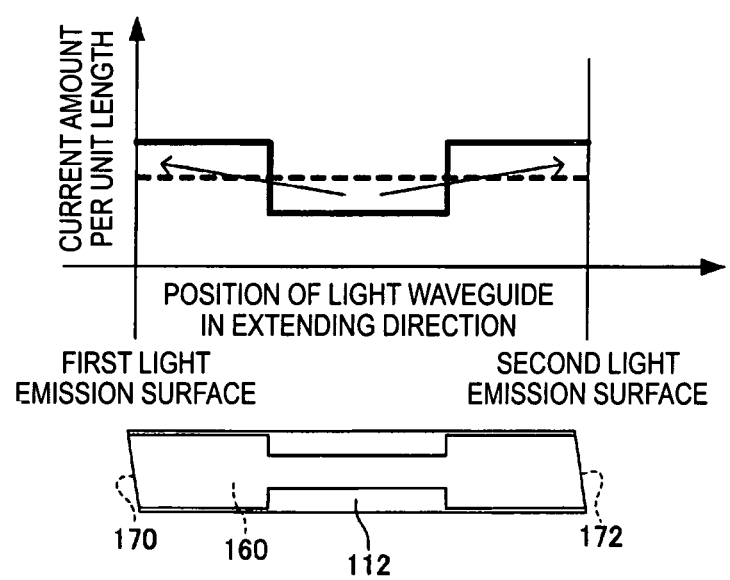
FIG. 17 is a diagram for explaining a relationship between a position of the light waveguide in the extending direction and a current amount per unit length.

In the light emitting device 400, as illustrated in FIG. 17, a current amount per unit length can be changed in a stepwise shape with respect to a position of the light waveguide in the extending direction by using the first end region 12, the second end region 22, and the central region 32.

In the light emitting device 400, it is possible to reduce the gain saturation and thus to achieve high output in the same manner as in the light emitting device 100.

1.3.4. Modification Example 4

Figure 18:
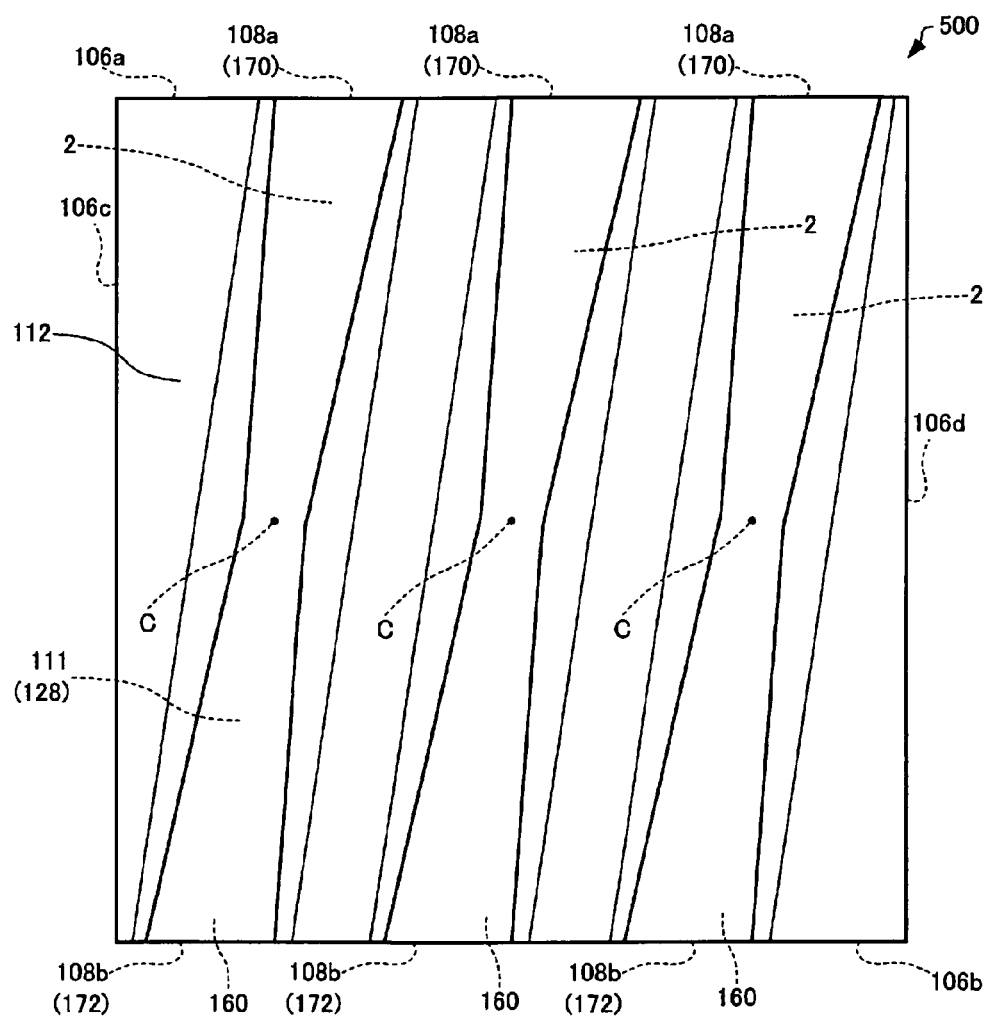
FIG. 18 is a plan view schematically illustrating a light emitting device according to Modification Example 4 of the first embodiment.

Next, a description will be made of a light emitting device according to Modification Example 4 of the first embodiment with reference to the drawings. FIG. 18 is a plan view schematically illustrating a light emitting device 500 according to Modification Example 4 of the first embodiment. For convenience, FIG. 18 does not illustrate the second electrode 122.

In the above-described light emitting device 100, as illustrated in FIG. 2, the light waveguide 160 is provided alone. In contrast, in the light emitting device 500, as illustrated in FIG. 18, a plurality of light waveguides 160 are provided. In the illustrated example, three light waveguides 160 are provided, but the number thereof is not particularly limited as long as a plurality of light waveguides are provided. The plurality of light waveguides 160 are provided at the same intervals in a direction parallel to the first side surface 106a, for example, in a plan view.

The light emitting device 500 can achieve higher output than the light emitting device 100.

1.3.5. Modification Example 5

Figure 19:
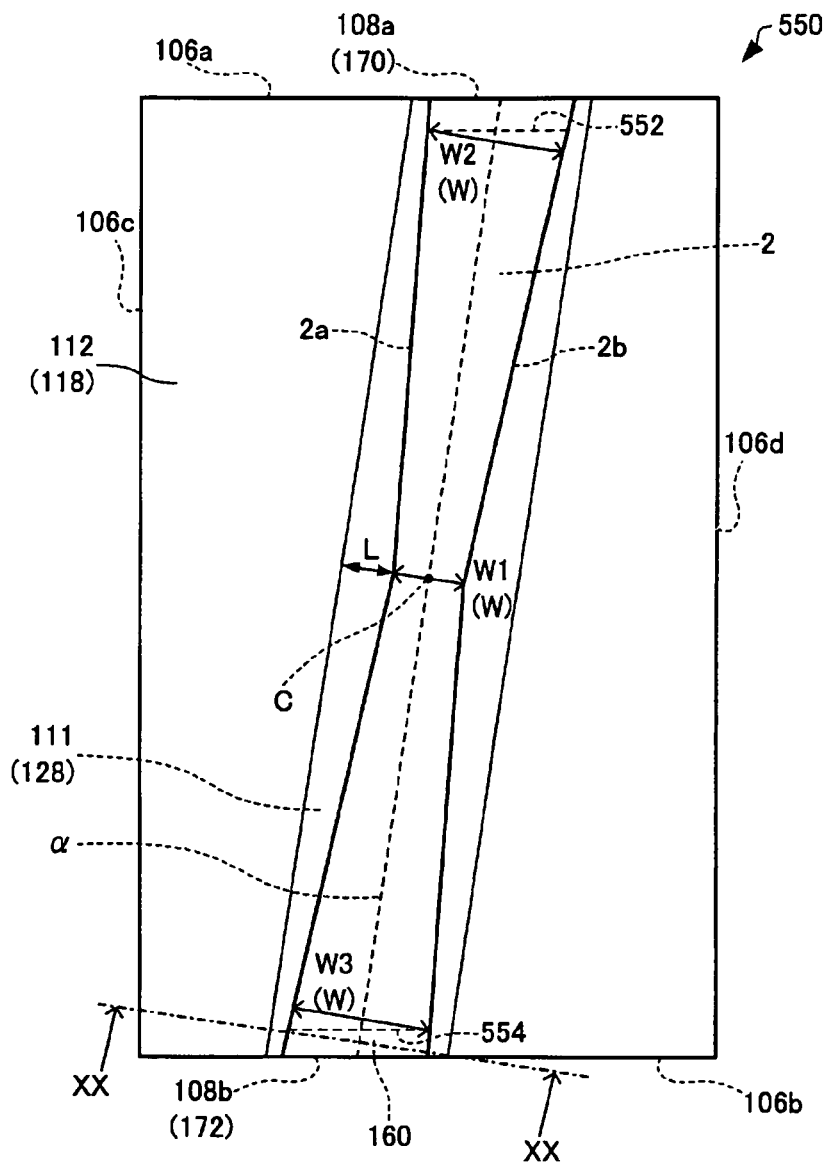
FIG. 19 is a plan view schematically illustrating a light emitting device according to Modification Example 5 of the first embodiment.
Figure 20:
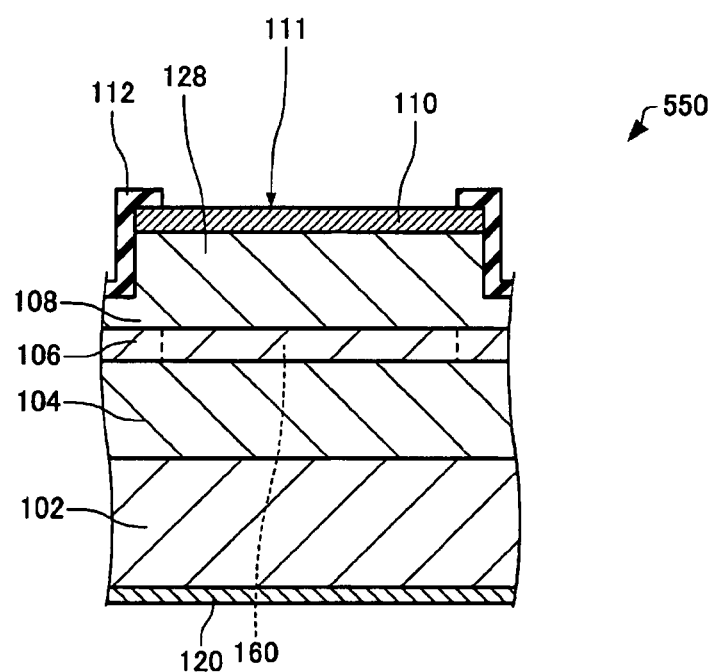
FIG. 20 is a sectional view schematically illustrating a light emitting device according to Modification Example 5 of the first embodiment.

Next, a description will be made of a light emitting device according to Modification Example 5 of the first embodiment with reference to the drawings. FIG. 19 is a plan view schematically illustrating a light emitting device 550 according to Modification Example 5 of the first embodiment. FIG. 20 is a sectional view taken along the line XX-XX of FIG. 19 and schematically illustrates the light emitting device 550 according to Modification Example 5 of the first embodiment. For convenience, FIG. 19 does not illustrate the second electrode 122.

In the light emitting device 100, as illustrated in FIG. 2, the ends of the electrical connection region 2 in the extending direction of the light waveguide 160 are the light emission surfaces 170 and 172. In contrast, in the light emitting device 550, as illustrated in FIG. 19, end portions 552 and 554 of the electrical connection region 2 in the extending direction of the light waveguide 160 are not the light emission surfaces 170 and 172.

Specifically, as illustrated in FIG. 20, the second electrode 122 is not provided in the vicinity of the light emission surfaces 170 and 172. More specifically, the light emission surfaces 170 and 172 do not overlap the second electrode 122. For this reason, the end portions 552 and 554 of the electrical connection region 2 in the extending direction of the light waveguide 160 are located further inward (toward the central position C side) than the light emission surfaces 170 and 172 in a plan view. The end portion 552 is located on the first light emission surface 170 side, and the end portion 554 is located on the second light emission surface 172 side.

In the light emitting device 550, a width W2 of the end portion 552 of the electrical connection region 2 indicates a line segment having the largest length among line segments which are perpendicular to the central line α in a plan view and extend from the end portion 552 to the boundary 2a or the boundary 2b. In the example illustrated in FIG. 19, the width W2 is a length of a line segment which is perpendicular to the central line α and extends from an end (end point) of the end portion 552 on the third side surface 106*c* side to the boundary 2*b*.

A width W3 of the end portion 554 of the electrical connection region 2 indicates a line segment having the largest length among line segments which are perpendicular to the central line α in a plan view and extend from the end portion 554 to the boundary 2*a* or the boundary 2*b*. In the example illustrated in FIG. 19, the width W3 is a length of a line segment which is perpendicular to the central line α and extends from an end (end point) of the end portion 554 on the fourth side surface 106*d* side to the boundary 2*a*.

2. Second Embodiment

2.1. Light Emitting Device

Figure 21:
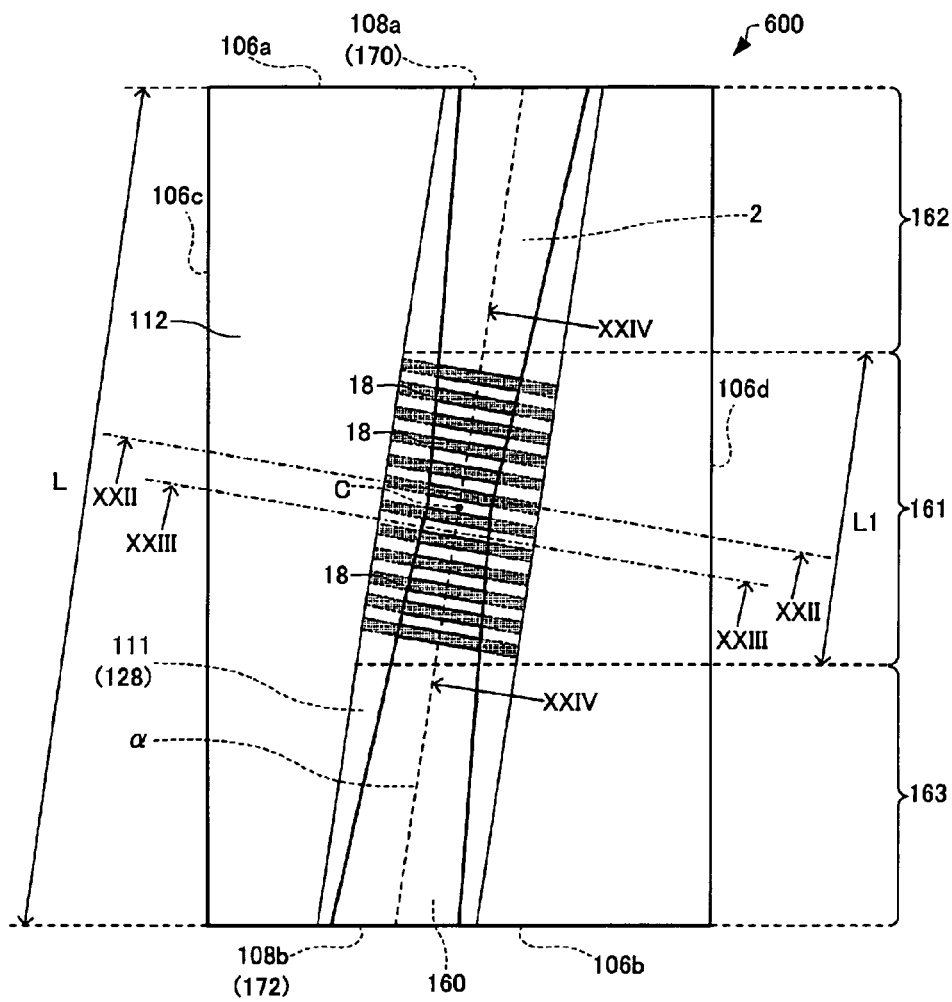
FIG. 21 is a plan view schematically illustrating a light emitting device according to a second embodiment.
Figure 22:
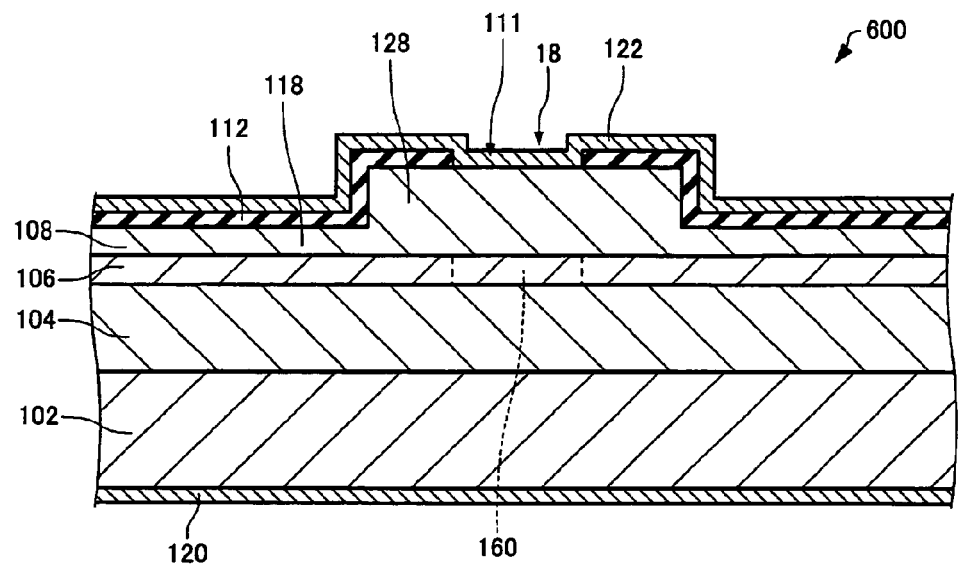
FIG. 22 is a sectional view schematically illustrating the light emitting device according to the second embodiment.
Figure 23:
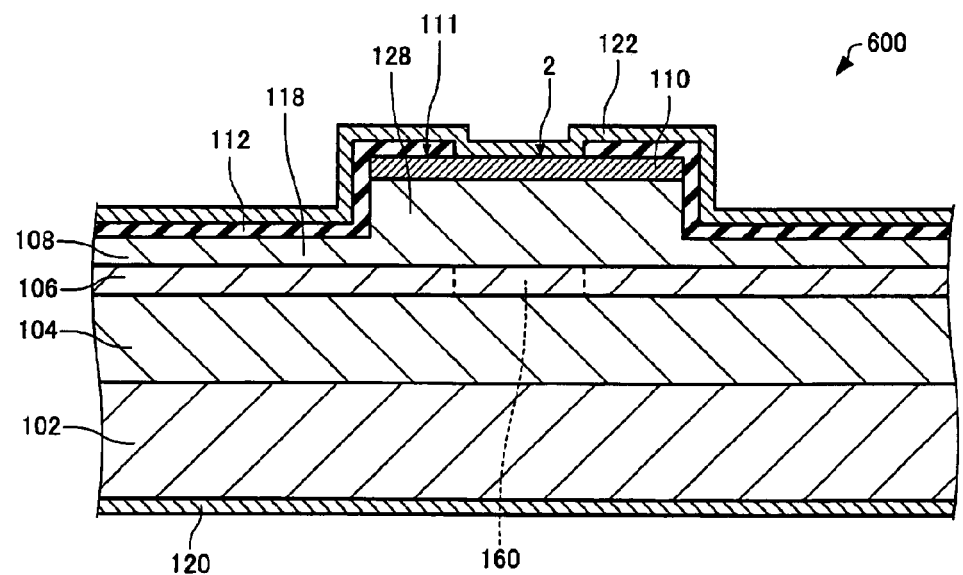
FIG. 23 is a sectional view schematically illustrating the light emitting device according to the second embodiment.
Figure 24:
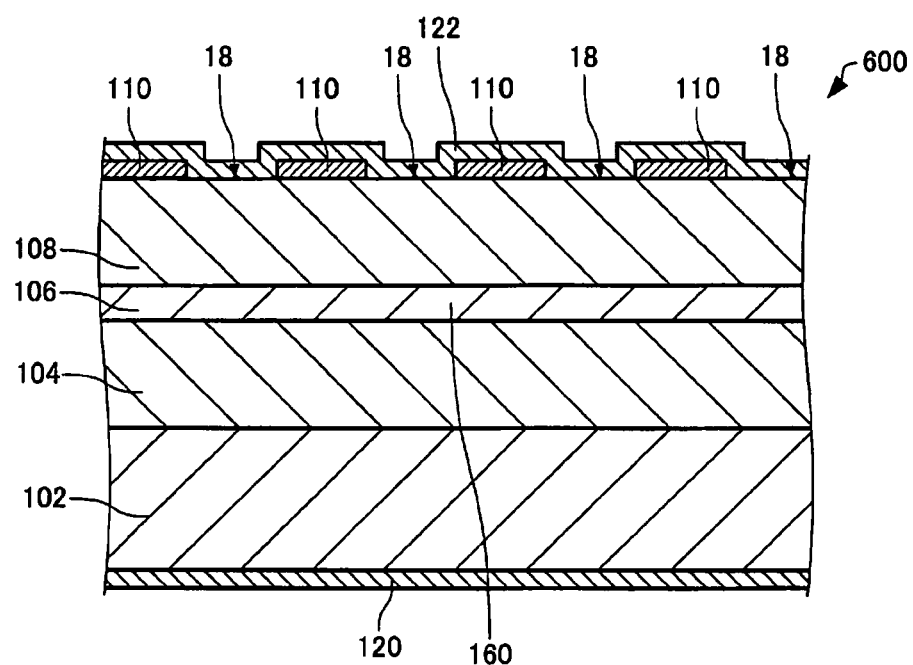
FIG. 24 is a sectional view schematically illustrating the light emitting device according to the second embodiment.

Next, a light emitting device according to a second embodiment will be described with reference to the drawings. FIG. 21 is a plan view schematically illustrating a light emitting device 600 according to the second embodiment. FIG. 22 is a sectional view taken along the line XXII-XXII of FIG. 21 and schematically illustrates the light emitting device 600 according to the second embodiment. FIG. 23 is a sectional view taken along the line XXIII-XXIII of FIG. 21 and schematically illustrates the light emitting device 600 according to the second embodiment. FIG. 24 is a sectional view taken along the line XXIV-XXIV of FIG. 21 and schematically illustrates the light emitting device 600 according to the second embodiment.

The light emitting device 600 is different from the above-described light emitting device 100 in that the second cladding layer 108 includes noncontact regions 18 which are not electrically connected to the second electrode 122 as illustrated in FIGS. 21 to 24.

The light waveguide 160 includes a first region 161, a second region 162, and a third region 163. The first region 161 is a region including the central position C. The second region 162 includes the first light emission surface 170. The third region 163 includes the second light emission surface 172. In the illustrated example, the second region 162 extends from the first light emission surface 170 to one end of the first region 161. The third region 163 extends from the second light emission surface 172 to the other end of the first region 161. Although not illustrated, the regions 161, 162 and 163 may be separated from each other.

A length L1 of the first region 161 in the extending direction of the light waveguide 160 is L/4 or more and 3L/4 or less when a length of the light waveguide 160 between the first light emission surface 170 and the second light emission surface 172 is set to L. The length L1 of the first region 161, a length of the second region 162 in the extending direction of light waveguide 160, and a length of the third region 163 in the extending direction of the light waveguide 160 may be the same as each other and may be L/3.

The noncontact regions 18 are not in contact with the contact layer 110 in a plan view. In the illustrated example, the noncontact regions 18 are not in contact with the contact layer 110 in the pillar shape portion 111. The noncontact regions 18 are in contact with, for example, the second electrode 122 and the insulating layer 112. The number of noncontact regions 18 is not particularly limited as long as a plurality of noncontact regions 18 are provided.

The plurality of noncontact regions 18 intersect the light waveguide 160 in a plan view. In other words, the noncontact regions 18 have portions which overlap the light waveguide 160 and portions which do not overlap the light waveguide 160 in a plan view. In the illustrated example, a planar shape of each of the noncontact regions 18 is a rectangular shape, and the light waveguide 160 intersects the long sides of the noncontact regions 18.

A length of each of the noncontact regions 18 in the extending direction of the light waveguide 160 is preferably 20 μm or less, and is more preferably 10 μm or less. Consequently, it is possible to reduce light loss in the portion (noncontact region overlapping portion) of the light waveguide 160 overlapping the noncontact regions 18 in a plan view. Specifically, a current which does not cause light loss can be diffused from the portion of the light waveguide 160 overlapping the contact layer 110 to the noncontact region overlapping portion.

In a plan view, a ratio (B1/A1) of an area B1 in which the plurality of noncontact regions 18 overlap the first region 161 to an area A1 of the first region 161 is greater than a ratio (B2/A2) of an area B2 in which the plurality of noncontact regions 18 overlap the second region 162 to an area A2 of the second region 162. The ratio (B1/A1) is greater than a ratio (B3/A3) of an area B3 in which the plurality of noncontact regions 18 overlap the third region 163 to an area A3 of the third region 163. In the illustrated example, the plurality of noncontact regions 18 overlap only the light waveguide 160 in the first region 161 in a plan view.

Pitches of the noncontact regions 18 overlapping the first region 161 are the same as each other. In other words, shapes and sizes of the plurality of noncontact regions 18 are the same as each other, and intervals between the respective noncontact regions 18 which are adjacent to each other are the same as each other. The pitch of the noncontact regions 18 is a distance between the centers of the noncontact regions 18 which are adjacent to each other, for example, in a plan view. In FIG. 21, the shapes, the sizes, and the pitches of the plurality of noncontact regions 18 are the same each other, but the shapes, the sizes, and the pitches thereof are not necessarily the same as each other.

The noncontact regions 18 are disposed so as to be symmetric to each other with respect to, for example, the central position C. Consequently, the intensity of light emitted from the first light emission surface 170 can be made the same as the intensity of light emitted from the second light emission surface 172.

In the light emitting device 600, the second cladding layer 108 includes the plurality of noncontact regions 18 which are not electrically connected to the second electrode 122; the plurality of noncontact regions 18 intersect the light waveguide 160 in a plan view; the ratio (B1/A1) of the area B1 in which the plurality of noncontact regions 18 overlap the first region 161 to the area A1 of the first region 161 is greater than the ratio (B2/A2) of the area B2 in which the plurality of noncontact regions 18 overlap the second region 162 to the area A2 of the second region 162; and the ratio (B1/A1) is greater than the ratio (B3/A3) of the area B3 in which the plurality of noncontact regions 18 overlap the third region 163 to the area A3 of the third region 163. Therefore, in the light emitting device 600, the noncontact regions 18 are not in ohmic contact with the second electrode 122 and thus have high resistance, and an amount of current injected into the active layer 106 overlapping the noncontact regions 18 is small. For this reason, in the light emitting device 600, the ratio (B1/A1) is made greater than the ratio (B2/A2) and the ratio (B3/A3), and thus it is possible to relatively increase an amount of current injected into the regions 162 and 163 by reducing an amount of current injected to the first region 161. Consequently, even if the entire amount of injected current is the same, it is possible to reduce gain saturation and thus to achieve high output.

2.2. Manufacturing Method of Light Emitting Device

Next, a description will be made of a manufacturing method of the light emitting device 600 according to the second embodiment. The manufacturing method of the light emitting device 600 according to the second embodiment is fundamentally the same as the manufacturing method of the light emitting device 100 according to the first embodiment except that the noncontact regions 18 are formed by patterning the contact layer 110. Therefore, detailed description thereof will be omitted.

2.3. Modification Example of Light Emitting Device

Figure 25:
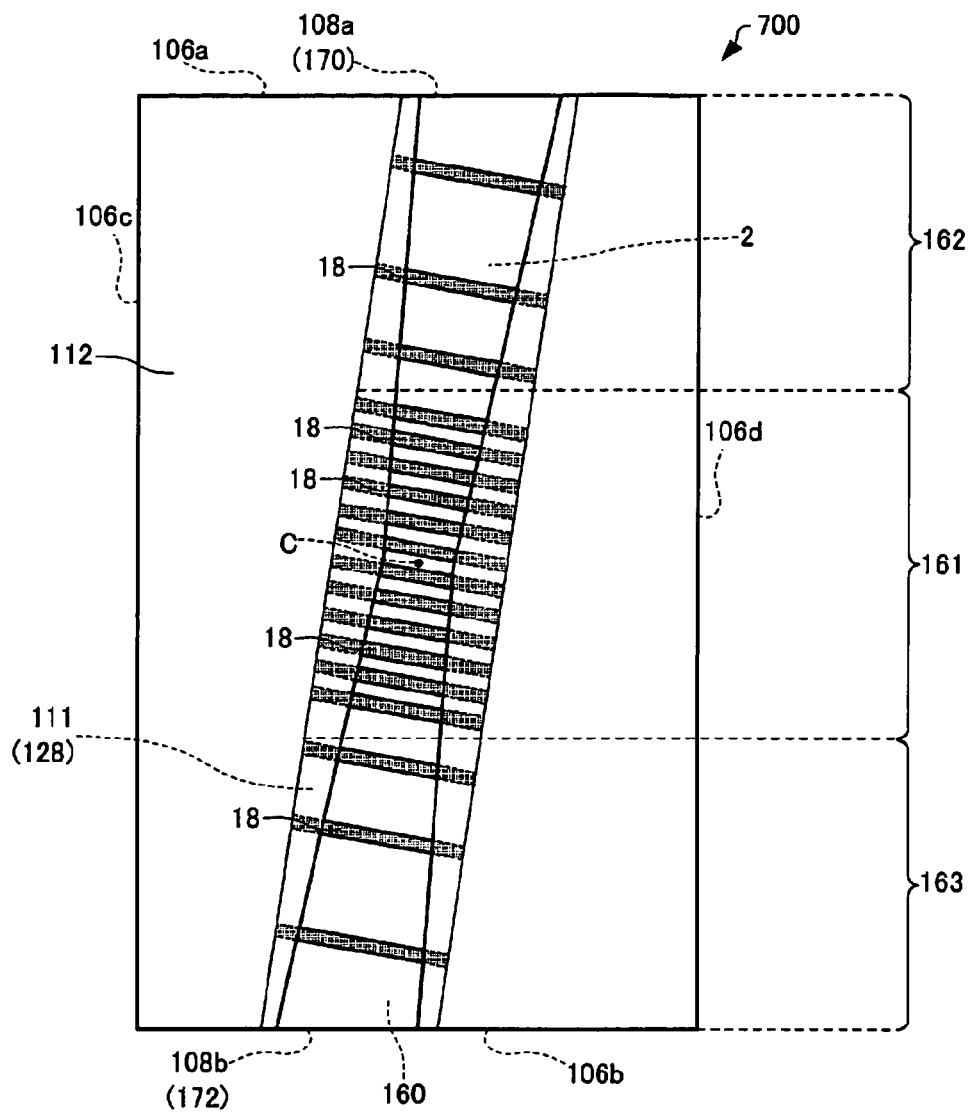
FIG. 25 is a plan view schematically illustrating a light emitting device according to a modification example of the second embodiment.

Next, a description will be made of a light emitting device according to a modification example of the second embodiment with reference to the drawings. FIG. 25 is a plan view schematically illustrating a light emitting device 700 according to the modification example of the second embodiment. For convenience, FIG. 25 does not illustrate the second electrode 122.

Hereinafter, in the light emitting device 700 according to the modification example of the second embodiment, differences from the examples of the light emitting device 100 according to the first embodiment and the light emitting device 600 according to the second embodiment will be described, and similarities thereto will not be described.

In the above-described light emitting device 600, as illustrated in FIG. 21, the noncontact regions 18 only intersect the light waveguide 160 in the first region 161 in a plan view. In contrast, in the light emitting device 700, as illustrated in FIG. 25, the noncontact regions 18 also intersect the light waveguide 160 in the second region 162 and the light waveguide 160 in the third region 163 in a plan view.

In the light emitting device 700, the pitches of the plurality of noncontact regions 18 overlapping the second region 162 are gradually increased toward the first light emission surface 170 from the central position C in a plan view. The pitches of the plurality of noncontact regions 18 overlapping the third region 163 are gradually increased toward the second light emission surface 172 from the central position C in a plan view.

In the light emitting device 700, it is possible to reduce the gain saturation and thus to achieve high output in the same manner as in the light emitting device 600.

Although not illustrated, in a plan view, the pitches of the plurality of noncontact regions 18 may be gradually increased toward the first light emission surface 170 from the central position C and may be increased toward the second light emission surface 172 from the central position C. Although not illustrated, an insulating layer may be provided between the noncontact regions 18 and the second electrode 122. Although not illustrated, the upper surface of the pillar shape portion 111 may be provided with depressions, and the noncontact regions 18 may constitute bottoms of the depressions. In this case, a depth of each of the depressions may be smaller than the thickness (height)) of the pillar shape portion 111. The noncontact regions 18 may not be disposed so as to symmetric to each other with respect to the central position C.

3. Third Embodiment

Figure 26:
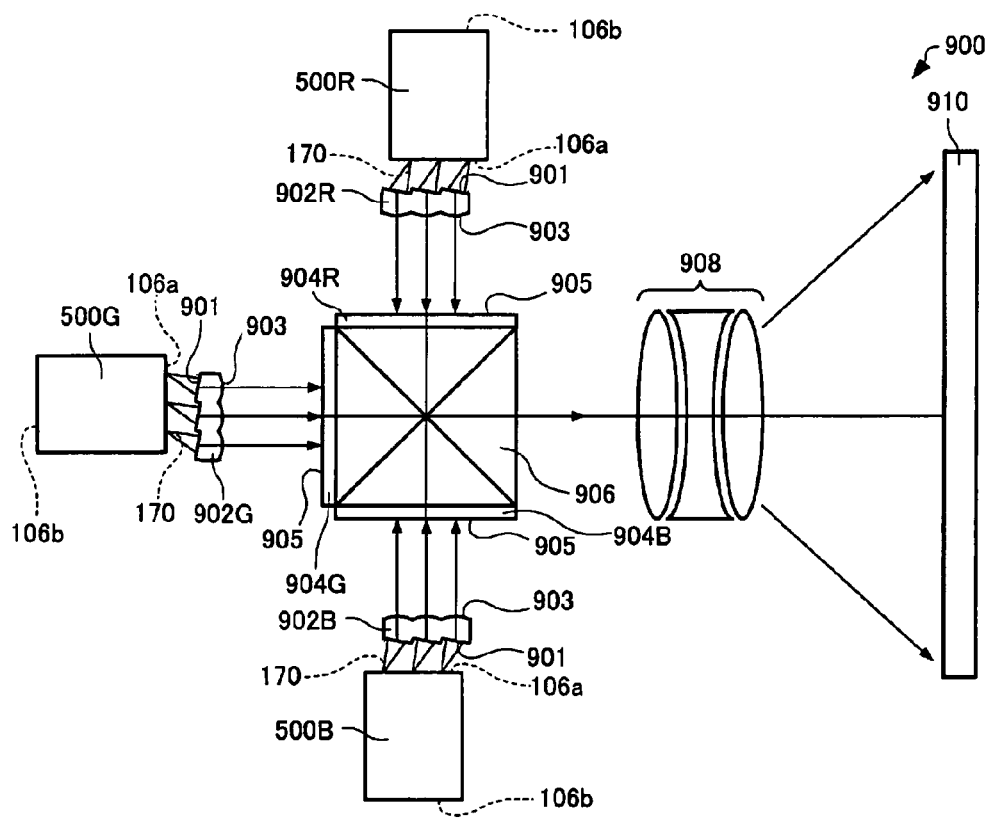
FIG. 26 is a diagram schematically illustrating a projector according to a third embodiment.

Next, a description will be made of a projector according to a third embodiment with reference to the drawing. FIG. 26 is a diagram schematically illustrating a projector 900 according to the third embodiment. For convenience, in FIG. 26, a casing constituting the projector 900 is not illustrated, and light sources 500R, 500G and 500B are illustrated for simplification.

As illustrated in FIG. 26, the projector 900 includes the red light source 500R, the green light source 500G, and the blue light source 500B which respectively emit red light, green light, and blue light. The red light source 500R, the green light source 500G, and the blue light source 500B are light emitting devices according to the embodiment of the invention. Hereinafter, a description will be made of an example in which the light emitting device 500 is used as a light emitting device according to the embodiment of the invention.

The projector 900 further includes lens arrays 902R, 902G and 902B, transmissive type liquid crystal light valves (light modulation devices) 904R, 904G and 904B, and a projection lens (projection device) 908.

Light beams emitted from the light sources 500R, 500G and 500B are respectively incident to the lens arrays 902R, 902G and 902B. Each of the lens arrays 902R, 902G and 902B has an incidence surface 901 to which light emitted from the first light emission surface 170 is incident, on each side of the light sources 500R, 500G and 500B. The incidence surface 901 is, for example, a flat surface. A plurality of incidence surfaces 901 are provided so as to correspond to a plurality of first light emission surfaces 170 and are disposed at the same intervals. A normal line (not illustrated) of the incidence surface 901 is tilted with respect to the first side surface 106a. The incidence surfaces 901 can cause optical axes of the light beams emitted from the first light emission surfaces 170 to be perpendicular to irradiation surfaces 905 of the liquid crystal light valves 904R, 904G and 904B.

Each of the lens arrays 902R, 902G and 902B has an emission surface 903 on each side of the liquid crystal light valves 904R, 904G and 904B. The emission surface 903 is, for example, a convex surface. A plurality of emission surfaces 903 are provided so as to correspond to the plurality of incidence surfaces 901 and are disposed at the same intervals. The light beams whose optical axes are converted in the incidence surfaces 901 may be collected via the emission surfaces 903 or may be superimposed (partially superimposed) by reducing diffusion angles thereof. Consequently, the liquid crystal light valves 904R, 904G and 904B can be uniformly irradiated.

As mentioned above, the lens arrays 902R, 902G and 902B can control the optical axes of the light beams emitted from the first light emission surfaces 170 and can collect the light beams.

The light beams collected by the lens arrays 902R, 902G and 902B are respectively incident to the liquid crystal light valves 904R, 904G and 904B. The respective liquid crystal light valves 904R, 904G and 904B modulate the incident light beams according to image information. The projection lens 908 enlarges images formed by the liquid crystal light valves 904R, 904G and 904B and projects the enlarged images onto a screen (display surface) 910.

The projector 900 may include a cross dichroic prism (color light combining device) 906 which combines light beams emitted from the liquid crystal light valves 904R, 904G and 904B and guides combined light to the projection lens 908.

Three color light beams modulated by the liquid crystal light valves 904R, 904G and 904B are incident to the cross dichroic prism 906. The prism is formed by joining four right-angle prisms to each other, and a dielectric multilayer film reflecting red light and a dielectric multilayer film reflecting blue light are disposed in across shape. The three color light beams are combined with each other by the dielectric multilayer films, and thus light exhibiting a color image is formed. The combined light is projected onto the screen 910 by the projection lens 908 which is a projection optical system, and thus an enlarged image is displayed.

In the example illustrated in FIG. 26, light emitted from the second light emission surface 172 provided on the second side surface 106b is not illustrated, but the light may be incident to a reflection portion and a lens array (not illustrated) and may then be incident to the liquid crystal light valves 904R, 904G and 904B.

The projector 900 includes the light emitting device 500 which can reduce the gain saturation and can achieve high output. For this reason, the projector 900 can achieve high luminance.

In the above-described example, the transmissive type liquid crystal light valves are used as light modulation devices, but light valves other than the liquid crystal light valves may be used, and reflective type light valves may be used. Such light valves may include, for example, reflective type liquid crystal light valves or digital micromirror devices. A configuration of the projection optical system is changed as appropriate depending on the type of light valve which is used.

The light sources 500R, 500G and 500B are applicable to light emitting devices of a scanning type image display apparatus (projector) including a scanning device as an image forming device which displays an image with a desired size on a display surface by scanning the screen with light from the light sources 500R, 500G and 500B.

The above-described embodiments and modification examples are only examples, and the invention is not limited thereto. For example, the respective embodiments and the respective modification examples may be combined with each other as appropriate.

For example, the invention includes substantially the same configuration (for example, a configuration in which functions, methods, and results are the same, or a configuration in which objects and effects are the same) as the configuration described in the embodiment. The invention includes a configuration in which an inessential part of the configuration described in the embodiment is replaced with another part. The invention includes a configuration which achieves the same operation and effect or a configuration capable of achieving the same object as in the configuration described in the embodiment. The invention includes a configuration in which a well-known technique is added to the configuration described in the embodiment.

The entire disclosure of Japanese Patent Application No. 2014-260944 filed Dec. 24, 2014 is hereby expressly incorporated by reference herein.

What is claimed is:

1. A light emitting device comprising:
   a first cladding layer;
   an active layer provided on the first cladding layer, the active layer being configured to generate light in accordance with a current injected thereinto;
   a second cladding layer provided on the active layer, the second cladding layer including a ridge portion, the ridge portion being thicker than a remaining portion of the second cladding layer; and
   a first electrode and a second electrode that inject the current into the active layer,
   wherein the second electrode is provided over the ridge portion,
   wherein the ridge portion has a constant width in a plan view,
   wherein the second cladding layer includes an electrical connection region electrically connected to the second electrode,
   wherein the active layer constitutes a light waveguide through which the light is guided in a region overlapping the ridge portion in the plan view,
   wherein the light waveguide has a first light emission surface and a second light emission surface from which the light is emitted, and
   wherein, in the plan view, a width of the electrical connection region at a central position equidistant from the first light emission surface and the second light emission surface is smaller than a width of an end of the electrical connection region in an extending direction of the light waveguide.

2. The light emitting device according to claim 1, further comprising:
   a contact layer provided between the ridge portion and the second electrode,
   wherein, in the plan view, a width of the contact layer at the central position is smaller than a width of the contact layer at the end of the electrical connection region.

3. A projector comprising:
   the light emitting device according to claim 2;
   a light modulation device configured to modulate the light emitted from the light emitting device according to image information; and
   a projection device configured to project an image formed by the light modulation device.

4. The light emitting device according to claim 1,
   wherein, in the plan view, a width of the electrical connection region increases toward the end of the electrical connection region from the central position.

5. A projector comprising:
   the light emitting device according to claim 4;
   a light modulation device configured to modulate the light emitted from the light emitting device according to image information; and
   a projection device configured to project an image formed by the light modulation device.

6. The light emitting device according to claim 1,
   wherein the light waveguide extends in a tilted direction with respect to a normal line of the first light emission surface and a normal line of the second light emission surface.

7. A projector comprising:
   the light emitting device according to claim 6;
   a light modulation device configured to modulate the light emitted from the light emitting device according to image information; and
   a projection device configured to project an image formed by the light modulation device.

8. The light emitting device according to claim 1,
   wherein the light waveguide is provided with:
      a first region including the central position;
      a second region including the first light emission surface; and
      a third region including the second light emission surface,
   wherein the second cladding layer includes a plurality of noncontact regions that are not electrically connected to the second electrode,
   wherein the plurality of noncontact regions intersect the light waveguide in the plan view, and wherein, in the plan view, a ratio of an area in which the plurality of noncontact regions overlap the first region to an area of the first region is greater than a ratio of an area in which the plurality of noncontact regions overlap the second region to an area of the second region, and is greater than a ratio of an area in which the plurality of noncontact regions overlap the third region to an area of the third region.

9. A projector comprising:

the light emitting device according to claim 8;

a light modulation device configured to modulate the light emitted from the light emitting device according to image information; and a projection device configured to project an image formed by the light modulation device.

10. A projector comprising:

the light emitting device according to claim 1;

a light modulation device configured to modulate the light emitted from the light emitting device according to image information; and a projection device configured to project an image formed by the light modulation device.

* * * * *